(12) United States Patent
Kumagai et al.

(10) Patent No.: US 6,347,048 B2
(45) Date of Patent: Feb. 12, 2002

(54) SEMICONDUCTOR MEMORY DEVICE

(75) Inventors: Takashi Kumagai; Masahiro Takeuchi; Satoru Kodaira, all of Chino; Takafumi Noda, Sakata, all of (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/841,105

(22) Filed: Apr. 25, 2001

(30) Foreign Application Priority Data

Apr. 27, 2000 (JP) .......................................... 12-126963

(51) Int. Cl.$^7$ .............................................. G11C 11/00
(52) U.S. Cl. ......................... 365/154; 257/903; 257/368
(58) Field of Search ......................... 365/51, 154, 156; 257/903, 904, 368, 288

(56) References Cited

U.S. PATENT DOCUMENTS

| | | | | |
|---|---|---|---|---|
| 6,005,296 A | * | 12/1999 | Chan | 257/904 |
| 6,169,313 B1 | * | 1/2001 | Tsutsumi et al. | 257/390 |
| 6,232,670 B1 | * | 5/2001 | Kumagai et al. | 257/903 |
| 6,243,286 B1 | * | 6/2001 | Kumagai et al. | 365/154 |
| 6,246,605 B1 | * | 6/2001 | Ishida et al. | 365/154 |
| 6,271,569 B1 | * | 8/2001 | Ishigaki et al. | 257/381 |

FOREIGN PATENT DOCUMENTS

JP    A 10-41409    2/1998

OTHER PUBLICATIONS

SRAM Technologies for Mobile Era (Toshiba Review vol. 56, No. 1, 2001) pp. 42–44.
IEDM Technical Digest 1998 by M. Ishida et al.
U.S. Ser. No. 09/827,155, Docket: 109192, Kumagai et al., filed Apr. 6, 2001.
U.S. Ser. No. 09/827,391, Docket: 109191, Kumagai et al., filed Apr. 6, 2001.

* cited by examiner

Primary Examiner—David Nelms
Assistant Examiner—Gene N. Auduong

(57) ABSTRACT

A semiconductor memory device comprising first and second gate electrode layers in a first conductive layer, first and second drain-drain connecting layers in a second conductive layer, and first and second drain-gate connecting layers in a third conductive layer. The first and second drain-gate connecting layers are located higher than the first and second gate electrode layers. Therefore, a source contact layer can be located in the region between gate electrode layers while preventing a contact with the second drain-gate connecting layer.

12 Claims, 16 Drawing Sheets

SEMICONDUCTOR MEMORY DEVICE

TECHNICAL FIELD

The present invention relates to a semiconductor memory device such as a static random access memory (SRAM).

BACKGROUND

An SRAM, which is one type of semiconductor memory device, does not need refreshing. Therefore, the SRAM enables the system configuration to be simplified and consumes only a small amount of electric power. Because of this, the SRAM is suitably used as a memory for portable devices such as portable telephones.

There has been a demand for miniaturization of portable devices. To deal with this demand, the memory cell size of the SRAM must be reduced.

SUMMARY

An objective of certain embodiments of the present invention is to provide a semiconductor memory device having memory cells of a reduced size.

According to one embodiment of the present invention, there is provided a semiconductor memory device comprising:

a memory cell which includes a first driver transistor, a second driver transistor, a first load transistor, a second load transistor, a first transfer transistor, and a second transfer transistor, wherein:

the memory cell has first and second gate electrode layers, first and second drain-drain connecting layers, first and second drain-gate connecting layers, and a source contact layer;

the first gate electrode layer includes a gate electrode of the first driver transistor and a gate electrode of the first load transistor;

the second gate electrode layer includes a gate electrode of the second driver transistor and a gate electrode of the second load transistor;

a source region of the first and second driver transistors is located in a region between the first and second gate electrode layers;

the source contact layer is located in the region between the first and second gate electrode layers;

the first and second drain-drain connecting layers are located higher than the first and second gate electrode layers;

the first and second gate electrode layers are located between the first and second drain-drain connecting layers;

the first drain-drain connecting layer connects a drain region of the first driver transistor to a drain region of the first load transistor;

the second drain-drain connecting layer connects a drain region of the second driver transistor to a drain region of the second load transistor;

the first and second drain-gate connecting layers are located higher than the first and second gate electrode layers;

the first and second drain-gate connecting layers are located in a different layer from the first and second drain-drain connecting layers;

the first drain-gate connecting layer connects the first drain-drain connecting layer to the second gate electrode layer; and the second drain-gate connecting layer connects the second drain-drain connecting layer to the first gate electrode layer.

The semiconductor memory device according to this embodiment of the present invention includes the gate electrode layers which become gates of inverters, the drain-drain connecting layers for connecting drains of the inverters, and the drain-gate connecting layers for connecting the gate of one inverter to the drain of the other inverter. In this semiconductor memory device, a flip-flop is formed of three layers (gate electrode layer, drain-drain connecting layer, and drain-gate connecting layer). Therefore, the pattern of each layer can be simplified (linear pattern, for example) in comparison with the case of forming a flip-flop of two layers. According to this semiconductor memory device, since the pattern of each layer can be thus simplified, a semiconductor memory device with a memory cell size of 4.5 $\mu m^2$ or less can be fabricated, for example.

According to this semiconductor memory device, the first gate and second gate electrode layers are located between the first drain-drain connecting layer and the second drain-drain connecting layer. Therefore, the source contact layer of the driver transistors can be disposed at the center of the memory cell. Moreover, a wiring layer which is formed in the same layer as the drain-drain connecting layer and to which the source contact layer is connected can be disposed at the center of the memory cell. This increases the degree of freedom relating to the formation of the first and second drain-gate connecting layers, whereby the memory cell size can be reduced. In the present invention, the source contact layer is a conductive layer used to connect the source region of the driver transistor to the wiring layer.

According to this semiconductor memory device, the drain-gate connecting layers are located higher than the gate electrode layers and the drain-drain connecting layers. Therefore, the source contact layer can be located in the region between gate electrode layers (or region between the first gate electrode layer and second gate electrode layer) while preventing the drain-gate connecting layer from coming in contact with the source contact layer. Therefore, parasitic resistance of the driver transistors can be decreased. Moreover, the pattern of the source region can be simplified (for example, a pattern with a uniform width such as an approximately linear pattern or rectangular pattern), whereby reproducibility of the pattern of the source region can be improved in a photolithography process. This increases dimensional accuracy of the channel width of the driver transistors, whereby the operation of the memory cell can be stabilized.

In this semiconductor memory device, the width of the source region may be approximately uniform.

The source contact layer may be located in the source region.

This semiconductor memory device may further comprise a word line, wherein: the word line is located on the side of the first and second driver transistors; the word line includes gate electrodes of the first and second transfer transistors; and the word line has a linear pattern.

According to this configuration, since the pattern of the word line is linear, the length of the word line can be decreased in comparison with a word line having a partly curved pattern. Therefore, according to this configuration, the resistance of the word line can be decreased. The width of a word line having a partly curved pattern tends to be decreased at the curved section. This causes the narrow line effect of silicide to occur in a salicide of the word line, whereby the resistance of the word line locally increases.

According to this configuration, since the pattern of the word line is linear and does not have a curved section, occurrence of the narrow line effect of silicide caused by the curved section can be prevented, thereby preventing a local increase in the resistance of the word line due to the narrow line effect of silicide.

This semiconductor memory device may further comprise:

another memory cell which includes a third transfer transistor and a fourth transfer transistor;

first and second bit lines;

another word line; and a well contact region, wherein:

the other memory cell is located adjacent to the memory cell;

the first and third transfer transistors use in common a first source/drain region to which the first bit line is connected;

the second and fourth transfer transistors use in common a second source/drain region to which the second bit line is connected;

the other word line includes gate electrodes of the third and fourth transfer transistors;

the other word line has a linear pattern;

the well contact region is located between the word line and the other word line; and the memory cell and the other memory cell uses in common the well contact region.

According to this configuration, since the above word line and the other word line have a linear pattern, the well contact region can be located between the above word line and the other word line without increasing the memory cell area. Therefore, the size of the semiconductor memory device can be reduced.

According to this configuration, occurrence of latchup in the semiconductor memory device can be prevented. The reasons therefor are described below. Generally, when drain current flows by operating a transistor, substrate current (current from end section of drain to well contact region) flows. In particular, a large amount of substrate current flows in a driver transistor of which a word line is selected. An increase in the electric potential equivalent to the product of the substrate current and substrate resistance (well resistance) causes latchup to occur. According to this configuration, however, the well contact region can be disposed in the memory cell as well as in the well in which the driver transistors and the transfer transistors are formed. Moreover, the well contact region can be disposed in every memory cell in the direction of the word line. Therefore, the driver transistors and the well contact region can be located close together, whereby the substrate resistance can be decreased. Because of this, according to this configuration, occurrence of latchup can be prevented. In addition, the well contact region is preferably p-type.

In this semiconductor memory device, the word line may be located between the source region and the well contact region.

This semiconductor memory device may further comprise a contact pad layer, wherein:

the contact pad layer is used to connect the well contact region and the source region of the first and second driver transistors to a ground line; and the contact pad layer is located in the same layer as the first and second drain-drain connecting layers.

According to this configuration, since a plurality of contacts can be disposed from the contact pad layer to the ground line, the parasitic resistance of the source region can be reduced. According to this configuration, the first and second gate electrode layers are located between the first drain-drain connecting layer and the second drain-drain connecting layer, and the contact pad layer is located between the first gate electrode layer and the second gate electrode layer. The contact pad layer and each gate electrode layer have a relation in which one is the upper layer and the other is the lower layer. Therefore, the contact pad layer can be disposed in the same layer as the drain-drain connecting layers without increasing the memory cell size. According to this configuration, the memory cell and the other memory cell can use in common the contact pad layer having a linear pattern.

In this semiconductor memory device, the first and second driver transistors may be n-type;

the first and second load transistors may be p-type;

the first and second transfer transistors may be n-type;

the memory cell may include first, second, third and fourth conductive layers;

the first and second gate electrode layers and a sub-word line may be located in the first conductive layer;

the first and second drain-drain connecting layers, a power supply line, and first, second and third contact pad layers may be located in the second conductive layer;

the first and second drain-gate connecting layers, a main-word line, and fourth, fifth and sixth contact pad layers may be located in the third conductive layer;

first and second bit lines and a ground line may be located in the fourth conductive layer;

the sub-word line may extend in a first direction;

the power supply line may be connected to source regions of the first and second load transistors;

the first contact pad layer may be used to connect the first bit line to a source/drain region of the first transfer transistor;

the second contact pad layer may be used to connect the second bit line to a source/drain region of the second transfer transistor;

the third contact pad layer may be used to connect the source region of the first and second driver transistors to the ground line;

the main-word line may extend in the first direction;

the fourth contact pad layer may be used to connect the first bit line to the source/drain region of the first transfer transistor;

the fifth contact pad layer may be used to connect the second bit line to the source/drain region of the second transfer transistor;

the sixth contact pad layer may be used to connect the source region of the first and second driver transistors to the ground line; and the first and second bit lines may extend in a second direction which is perpendicular to the first direction.

According to this configuration, various properties (such as miniaturization, reliability, stability, and speed) required for semiconductor memory devices can be well-balanced and improved.

This semiconductor memory device may further comprise a plurality of the memory cells, a plurality of well contact regions of a primary conductivity type, and a plurality of well contact regions of a secondary conductivity type;

wherein each of the well contact regions of the primary conductivity type may be provided for a group of a predetermined number of memory cells arrayed in a first direction among the plurality of the memory cells; and wherein each of the well contact regions of the secondary conductivity type may be provided for a group of two of the memory cells arrayed in a second direction which is perpendicular to the first direction.

In this configuration, the well contact region of the secondary conductivity type can be provided for every two memory cells arrayed in the second direction. This is because the source contact layer can be located in the region between gate electrode layers as described above, thereby creating an areal margin near the boundary between the adjoining memory cells. Note that the predetermined number of memory cells may be 32 or 64, for example.

In this configuration, the primary conductivity type may be n-type and the secondary conductivity type may be p-type. According to this configuration, the well contact region of the well on which an n-type transistor is formed becomes p-type, and the well contact region of the well on which a p-type transistor is formed becomes n-type. This improves the latchup prevention effect. The reasons therefor are described below.

An increase in the electric potential equivalent to the product of the substrate current and the substrate resistance (well resistance) causes latchup to occur. Generally, the amount of the substrate current is greater in the n-type transistor than in the p-type transistor. For example, when the substrate current in the n-type transistor is $1 \times 10^{-6} A/\mu m$, the substrate current in the p-type transistor can be $1 \times 10^{-9} A/\mu m$, which is three digits smaller. The substrate resistance (well resistance) increases as the distance between the memory cell and the well contact region increases.

In this configuration, since the p-type well contact region is disposed in every two memory cells, the memory cell is located relatively close to the well contact region. Therefore, the substrate resistance (well resistance) can be relatively reduced. This ensures that the substrate resistance (well resistance) is relatively small even if the substrate current in the n-type transistor is relatively large, thereby preventing the product of the substrate current and the substrate resistance (well resistance) from increasing.

Since each n-type well contact region is provided for a group of a predetermined number (32, for example) of memory cells, some memory cells are located at a relatively long distance from the well contact region. Therefore, the substrate resistance (well resistance) relatively increases. However, since the substrate current in the p-type transistor is relatively small, the product of the substrate current and the substrate resistance (well resistance) can be prevented from increasing even if the substrate resistance (well resistance) is relatively large. These are reasons for improvement in the latchup prevention effect.

According to this configuration, the p-type well contact region can be connected to the ground line in the memory cell. This eliminates the need for a ground line used only for the p-type well contact region, whereby the size of the semiconductor memory device can be reduced.

In this semiconductor memory device, each of the first and second gate electrode layers and the first and second drain-drain connecting layers may have a linear pattern; and the first and second gate electrode layers and the first and second drain-drain connecting layers may be parallel to each other.

According to this configuration, since the pattern of each layer is simple, a semiconductor memory device with a minute memory cell size can be fabricated.

DETAILED DESCRIPTION

An embodiment of the semiconductor memory device according to the present invention will be described below. The present embodiment illustrates the case where the semiconductor memory device according to the present invention is applied to an SRAM. The outline of the structure of the present embodiment, the details of the structure, and the major effects of the present embodiment are described below.

1. Outline of Structure of the Present Embodiment

The semiconductor memory device of the present embodiment is a type of memory in which one memory cell is formed by six MOS field effect transistors. The outline of the structure of the present embodiment is described below by separately describing the structure of a section which forms a flip-flop of the memory cell and the structure of the memory cell.

(a) Structure of Section which Forms Flip-Flop of Memory Cell

Figure 1:
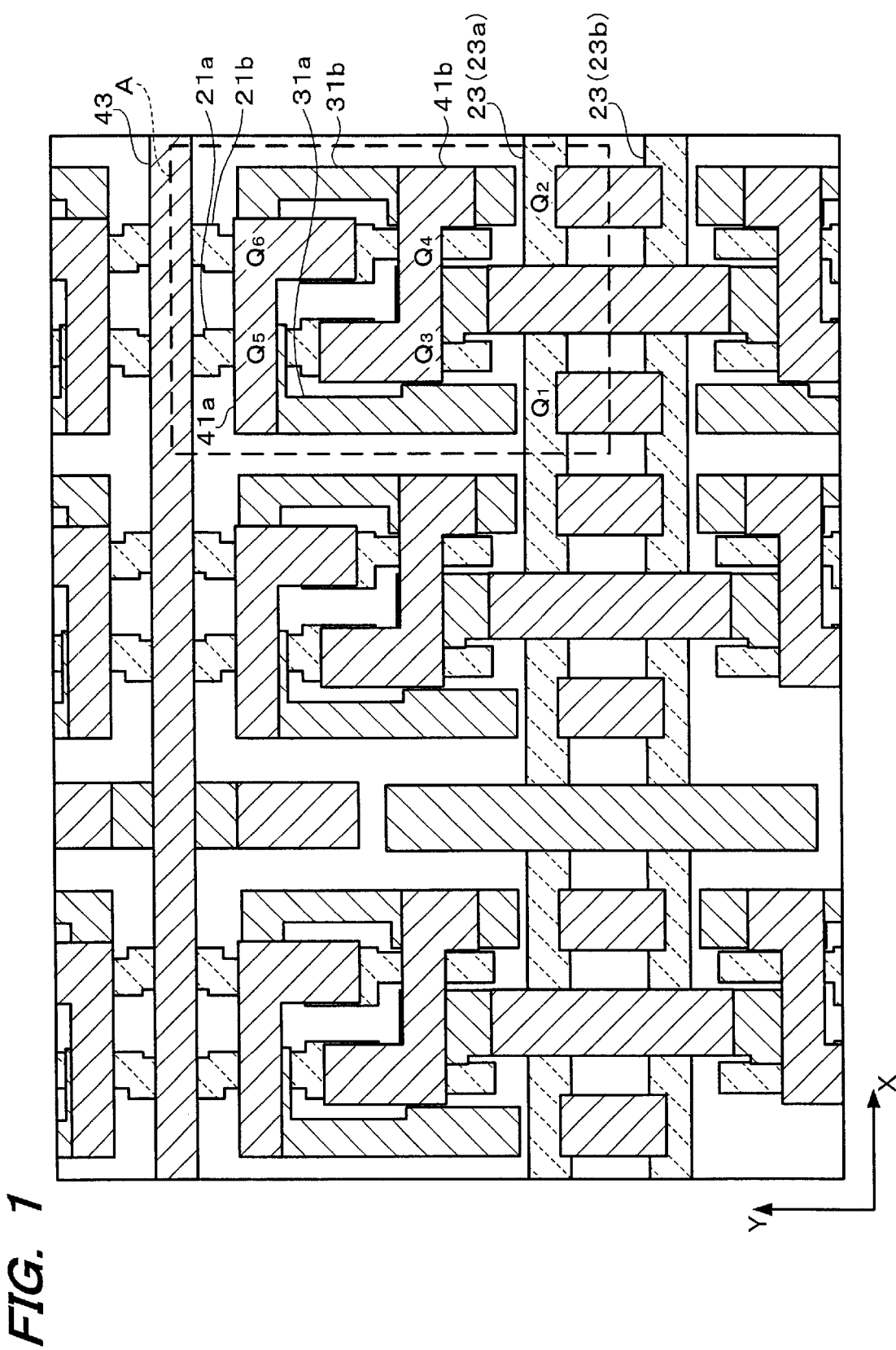
FIG. 1 is a plan view showing first, second and third conductive layers in part of a memory cell array of the embodiment of the present invention.

FIG. 1 is a plan view showing a first conductive layer, a second conductive layer, and a third conductive layer in part of a memory cell array of the present embodiment. The first conductive layer, the second conductive layer, and the third conductive layer are individually described to ensure that FIG. 1 is readily understood.

Figure 3:
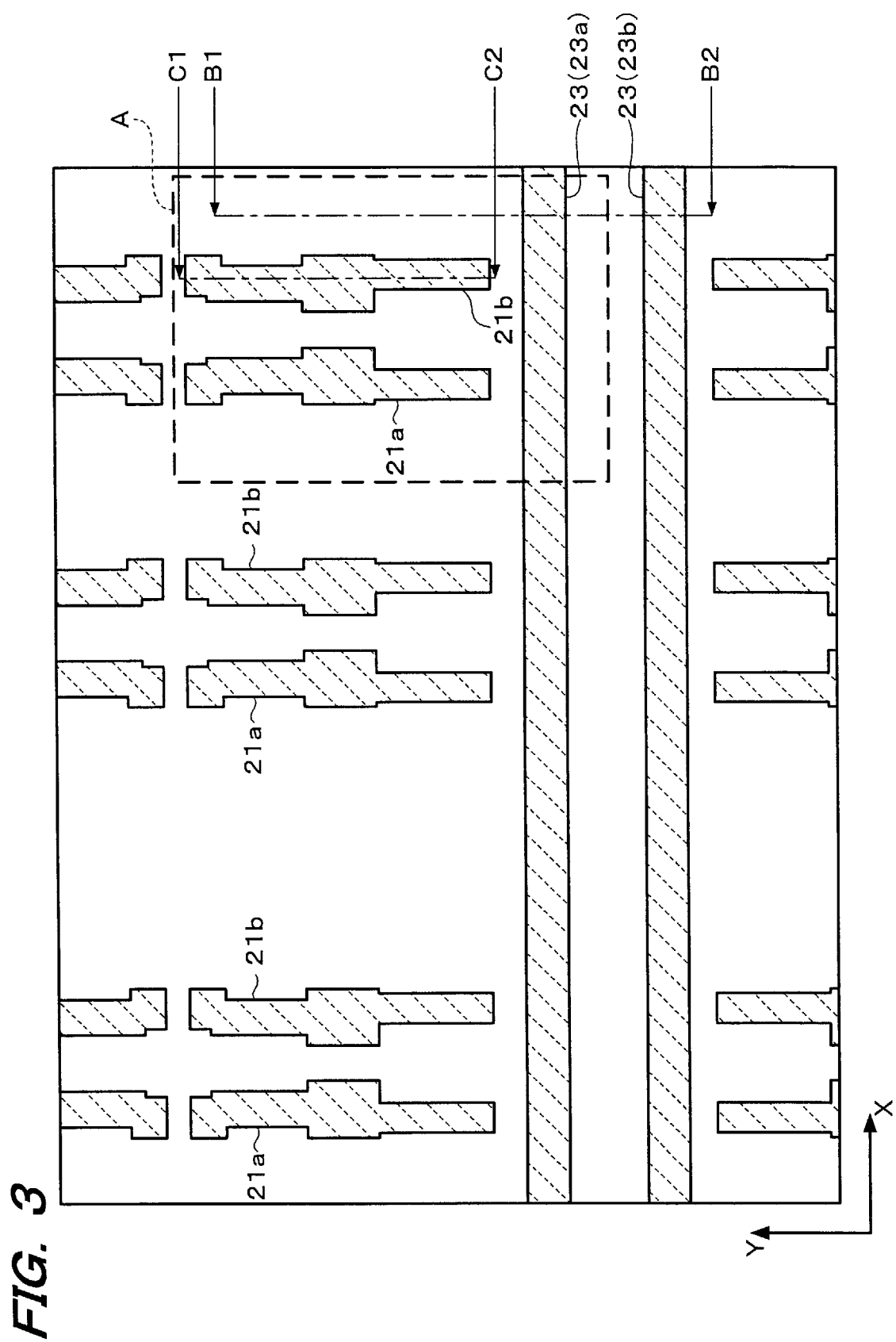
FIG. 3 is a plan view showing the first conductive layer in part of the memory cell array of the embodiment of the present invention.
Figure 5:
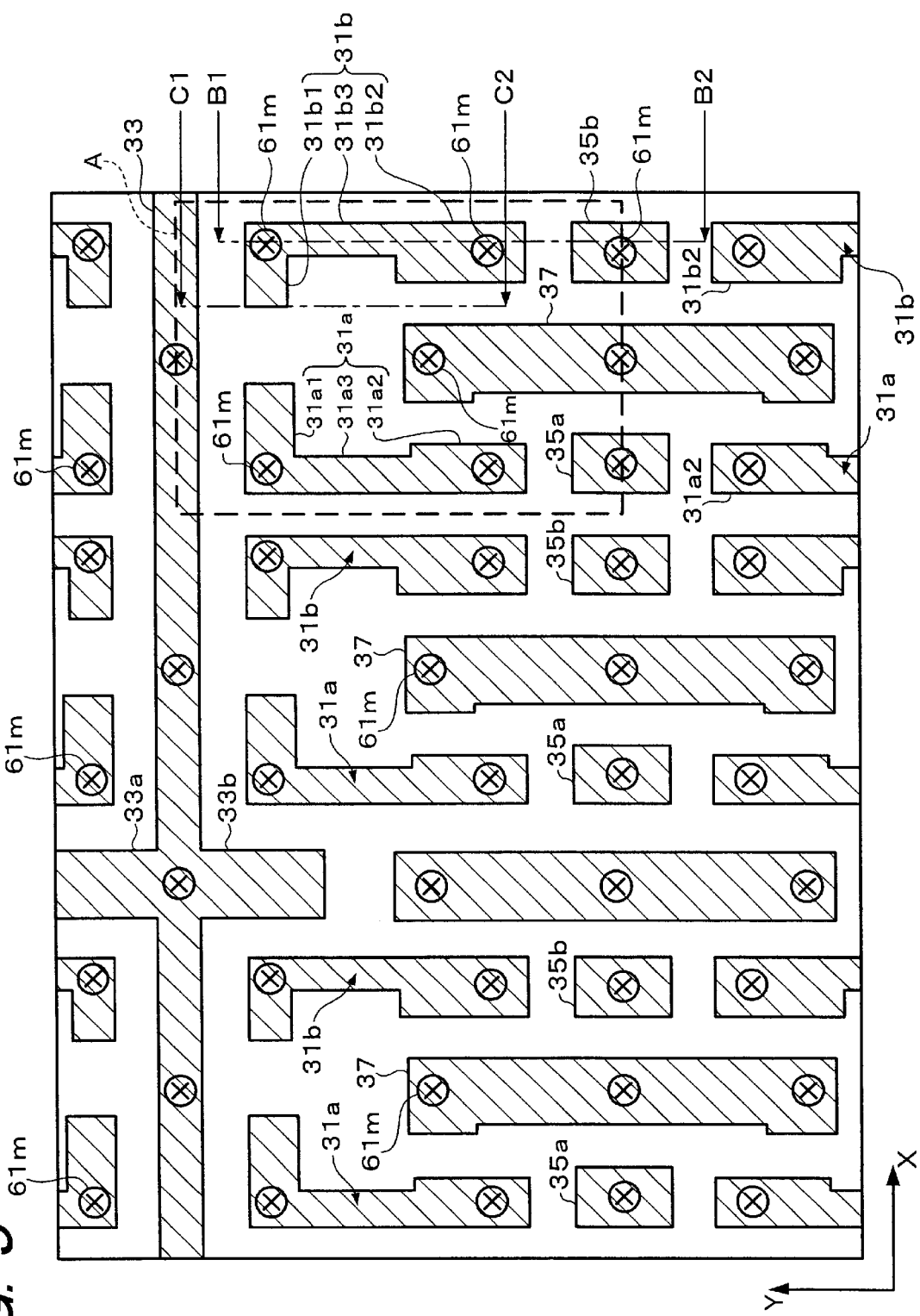
FIG. 5 is a plan view showing the second conductive layer in part of the memory cell array of the embodiment of the present invention.
Figure 8:
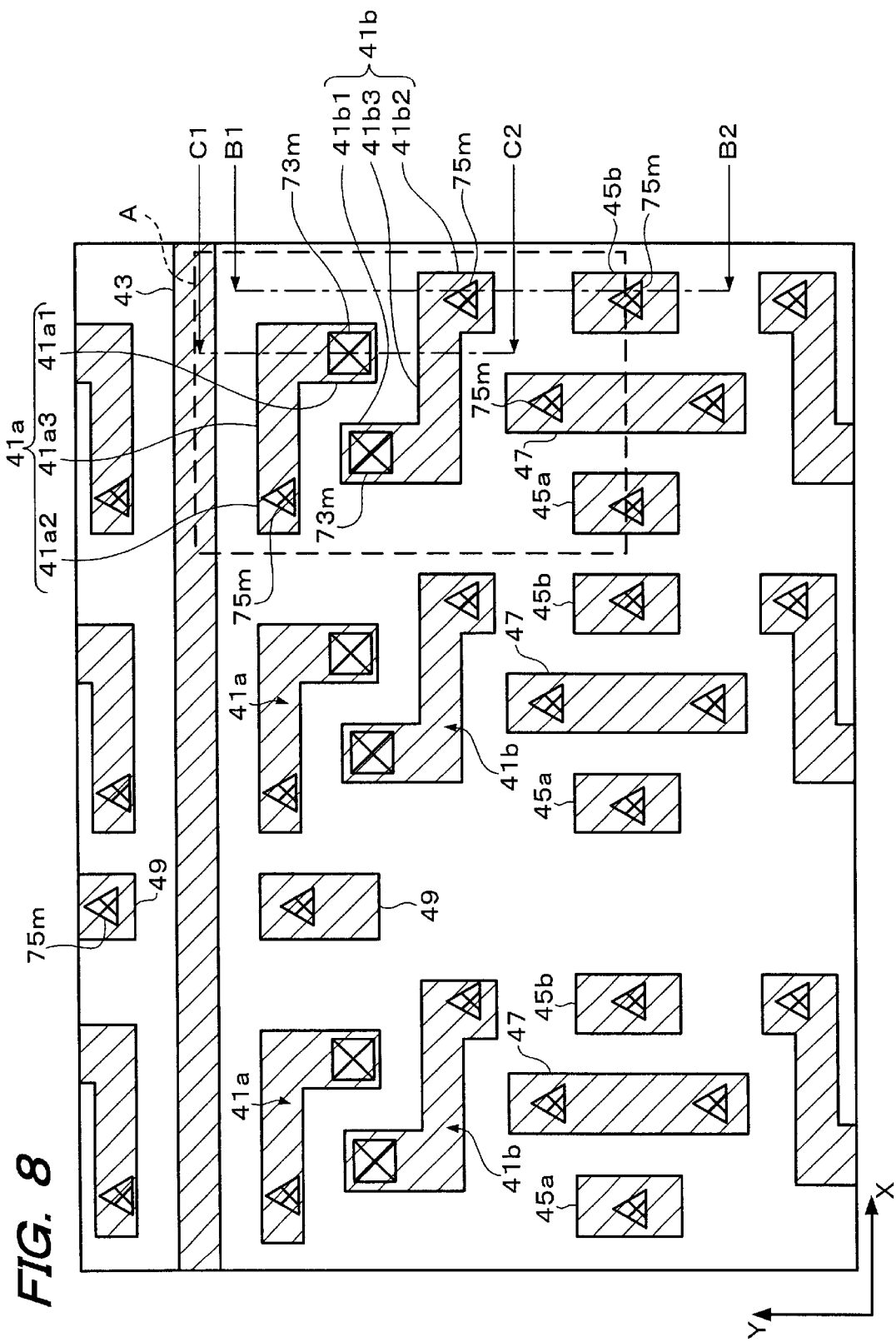
FIG. 8 is a plan view showing the third conductive layer in part of the memory cell array of the embodiment of the present invention.

Gate electrode layers 21a and 21b and sub-word lines 23 are disposed in the first conductive layer, as shown in FIG. 3. Drain-drain connecting layers 31a and 31b and the like are disposed in the second conductive layer, as shown in FIG. 5. Drain-gate connecting layers 41a and 41b and the like are disposed in the third conductive layer, as shown in FIG. 8. The structure shown in FIG. 5 is positioned on the structure shown in FIG. 3, and the structure shown in FIG. 8 is positioned on the structure shown in FIG. 5. FIG. 1 shows these structures collectively.

FIG. 1 shows a section which forms a flip-flop. This section is described below focusing on a region A. One memory cell is formed in the region A. The region A shown in other Figures has the same meaning.

Figure 16:
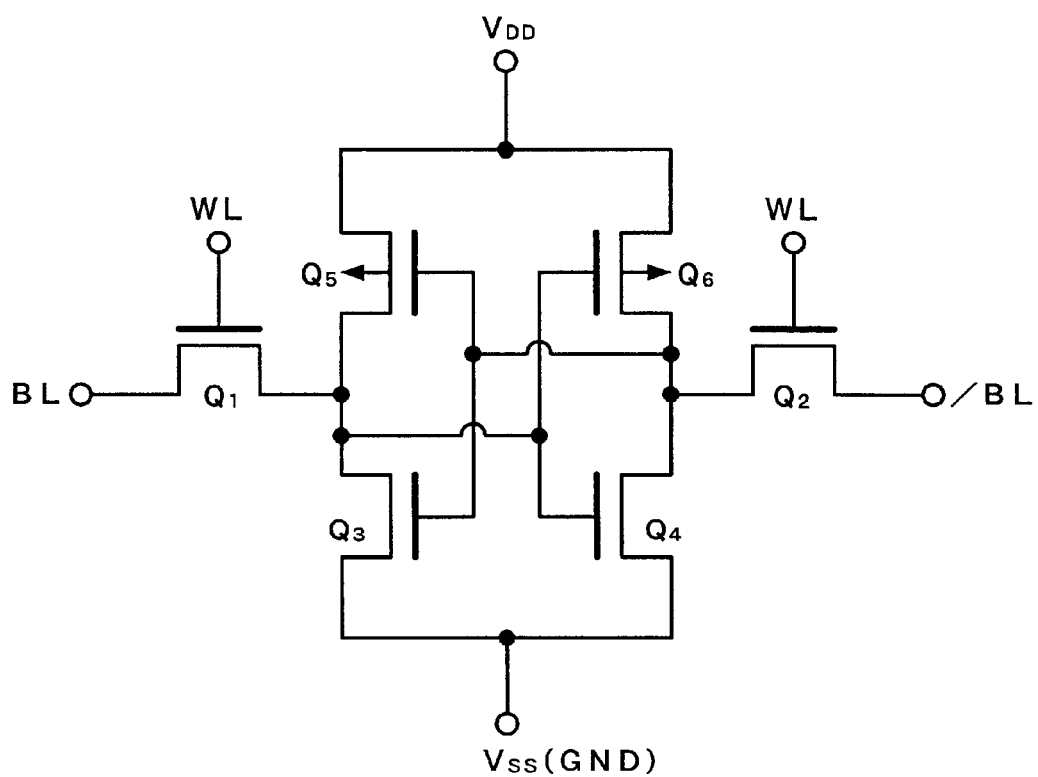
FIG. 16 is an equivalent circuit diagram of the SRAM according to the embodiment of the present invention.

In the region A, six MOS field effect transistors including n-channel transfer transistor $Q_1$ and $Q_2$, n-channel driver transistors $Q_3$ and $Q_4$, and p-channel load transistors $Q_5$, and $Q_6$ are formed. The driver transistor $Q_3$ and the load transistor $Q_5$ forms one CMOS inverter. The driver transistor $Q_4$ and the load transistor $Q_6$ forms one CMOS inverter. A flip-flop is formed by cross-coupling these two CMOS inverters. FIG. 16 shows an equivalent circuit of the circuit formed by the six MOS field effect transistors in the region A.

The gate electrode layer 21a and the gate electrode layer 21b respectively have a linear pattern, as shown in FIG. 1. The gate electrode layer 21a forms gate electrodes of the driver transistor $Q_3$ and the load transistor $Q_5$ and connects these gate electrodes. The gate electrode layer 21b forms gate electrodes of the driver transistor $Q_4$ and the load transistor $Q_6$ and connects these gate electrodes.

Drain of the driver transistor $Q_3$ and drain of the load transistor $Q_5$ are connected by the drain-drain connecting layer 31a. Drain of the driver transistor $Q_4$ and drain of the load transistor $Q_6$ are connected by the drain-drain connecting layer 31b. The drain-drain connecting layer 31a and the drain-drain connecting layer 31b respectively have a linear pattern.

The gate electrode (gate electrode layer 21a) of the driver transistor $Q_3$ and the load transistor $Q_5$ and the drain-drain connecting layer 31b are connected by the drain-gate connecting layer 41b. The gate electrode (gate electrode layer 21b) of the driver transistor $Q_4$ and the load transistor $Q_6$ and the drain-drain connecting layer 31a are connected by the drain-gate connecting layer 41a. The drain-gate connecting layer 41a and the drain-gate connecting layer 41b respectively have a pattern in the shape of the letter "L". The angle formed the first side and the second side of the L-shaped pattern are approximately 90°. The first side of the drain-gate connecting layer 41a faces the first side of the drain-gate connecting layer 41b. The second side of the drain-gate connecting layer 41a faces the second side of the drain-gate connecting layer 41b. The drain-gate connecting layer 41a and the drain-gate connecting layer 41b are approximately point-symmetrical.

The gate electrode layer 21a, the gate electrode layer 21b, the drain-drain connecting layer 31a, and the drain-drain connecting layer 31b are disposed in parallel. The gate electrode layers 21a and 21b are located between the drain-drain connecting layer 31a and the drain-drain connecting layer 31b.

(b) Structure of Memory Cell

Figure 2:
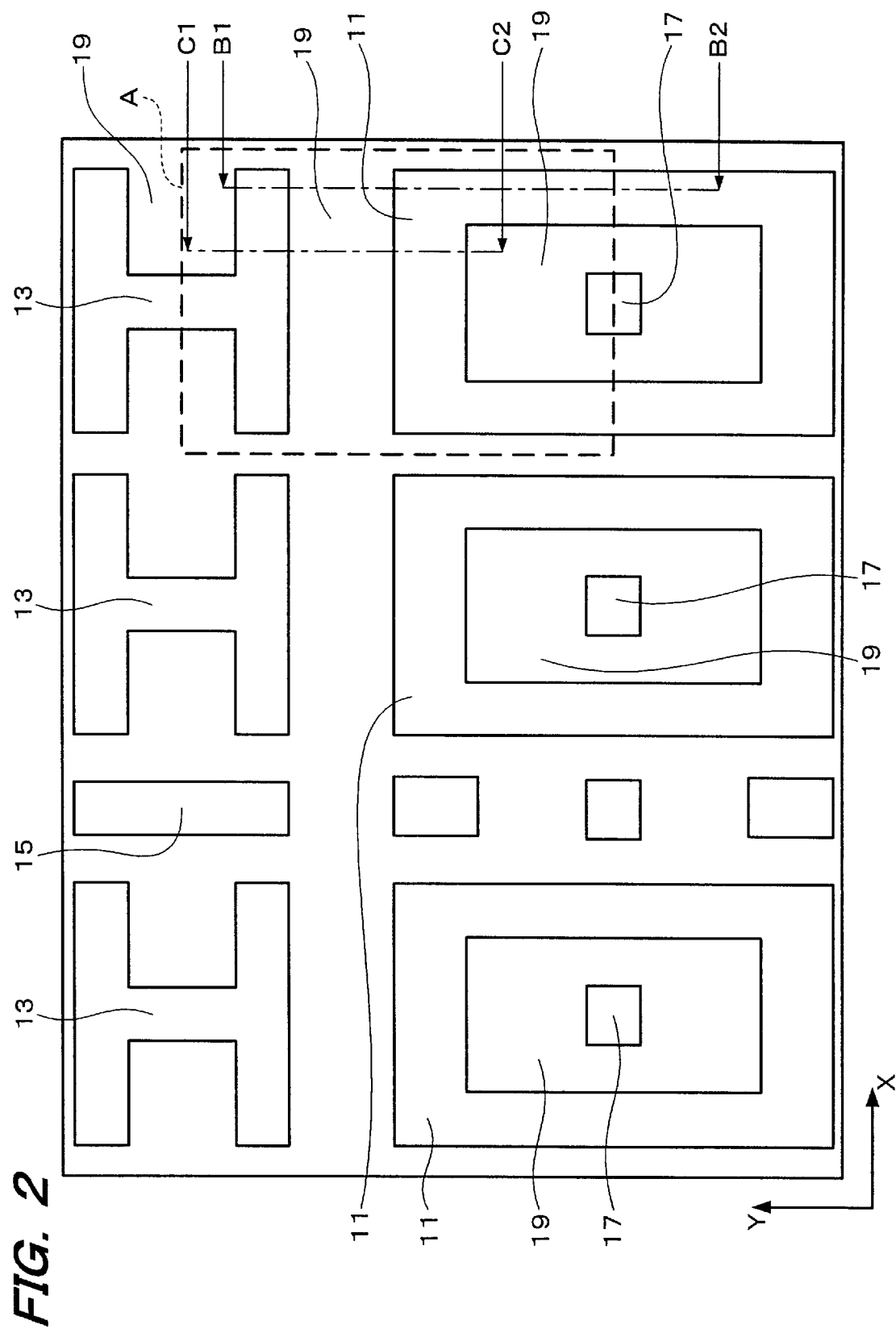
FIG. 2 is a plan view showing a field in part of the memory cell array of the embodiment of the present invention.
Figure 10:
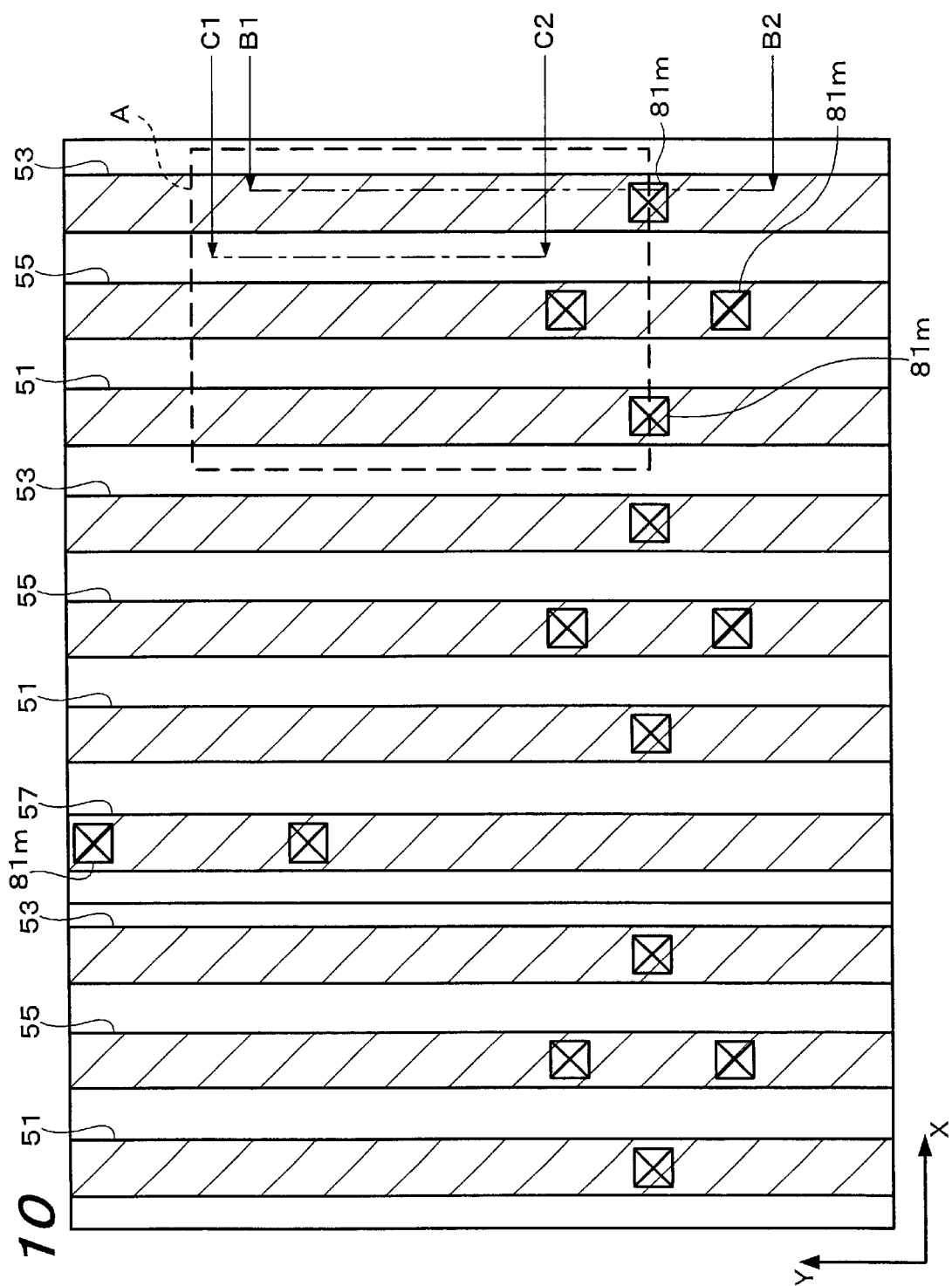
FIG. 10 is a plan view showing a fourth conductive layer in part of a memory cell array of the embodiment of the present invention.

The structure of the memory cell of the present embodiment is described below. The memory cell of the present embodiment has a structure in which the first conductive layer, the second conductive layer, the third conductive layer, and the fourth conductive layer are laminated on a field through interlayer dielectrics. The field is a region in which active regions 11, 13, 15, and 17 and element isolation regions 19 are located, as shown in FIG. 2. Bit lines 51 and the like are located in the fourth conductive layer, as shown in FIG. 10. The memory cell of the present embodiment has a structure in which the first conductive layer, the second conductive layer and the third conductive layer shown in FIG. 1 are located on the field shown in FIG. 2. The fourth conductive layer shown in FIG. 10 is located on the third conductive layer.

2. Details of Structure of the Present Embodiment

Figure 13:
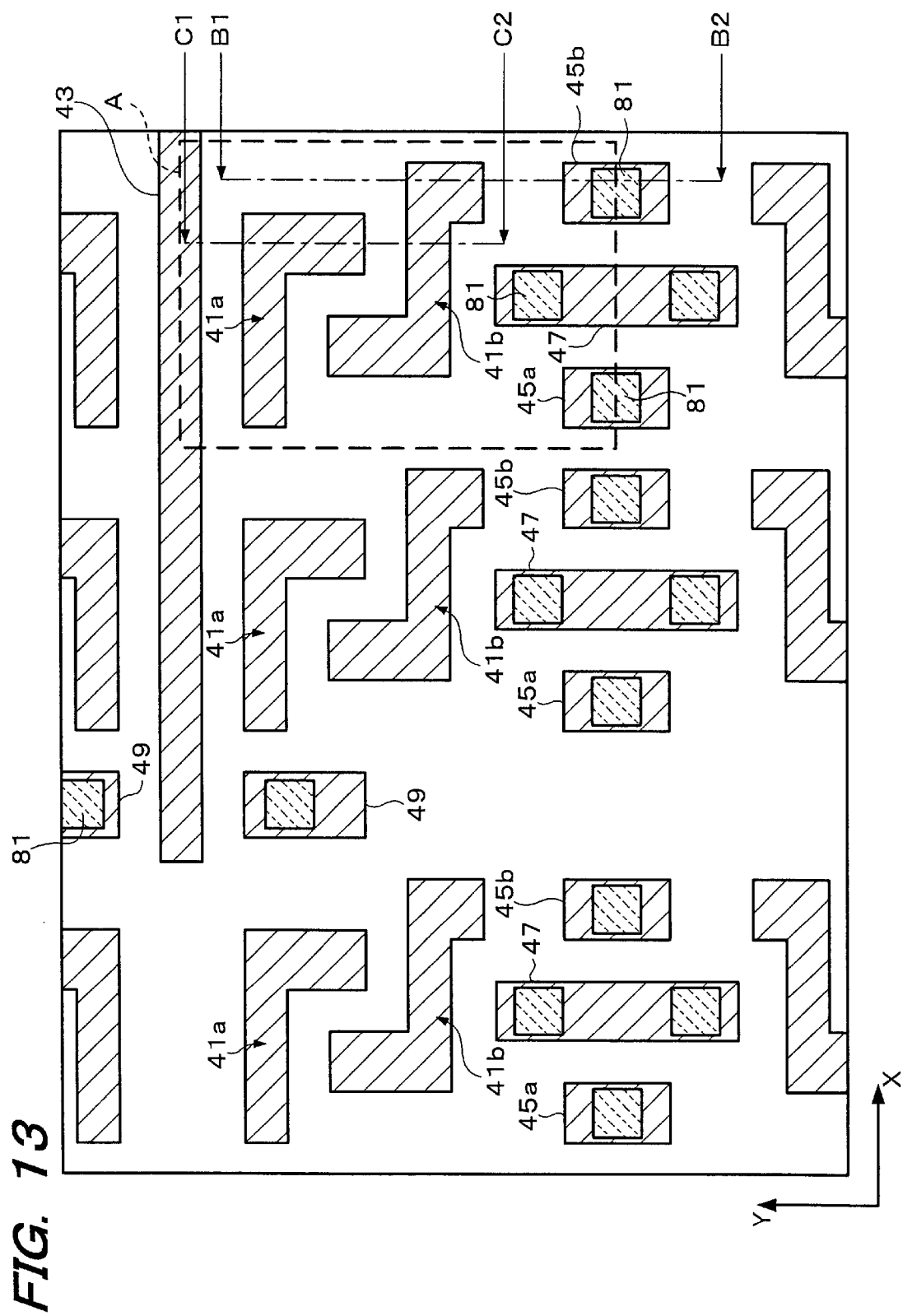
FIG. 13 is a plan view showing the third conductive layer and the plugs 81 in the embodiment of the present invention.
Figure 14:
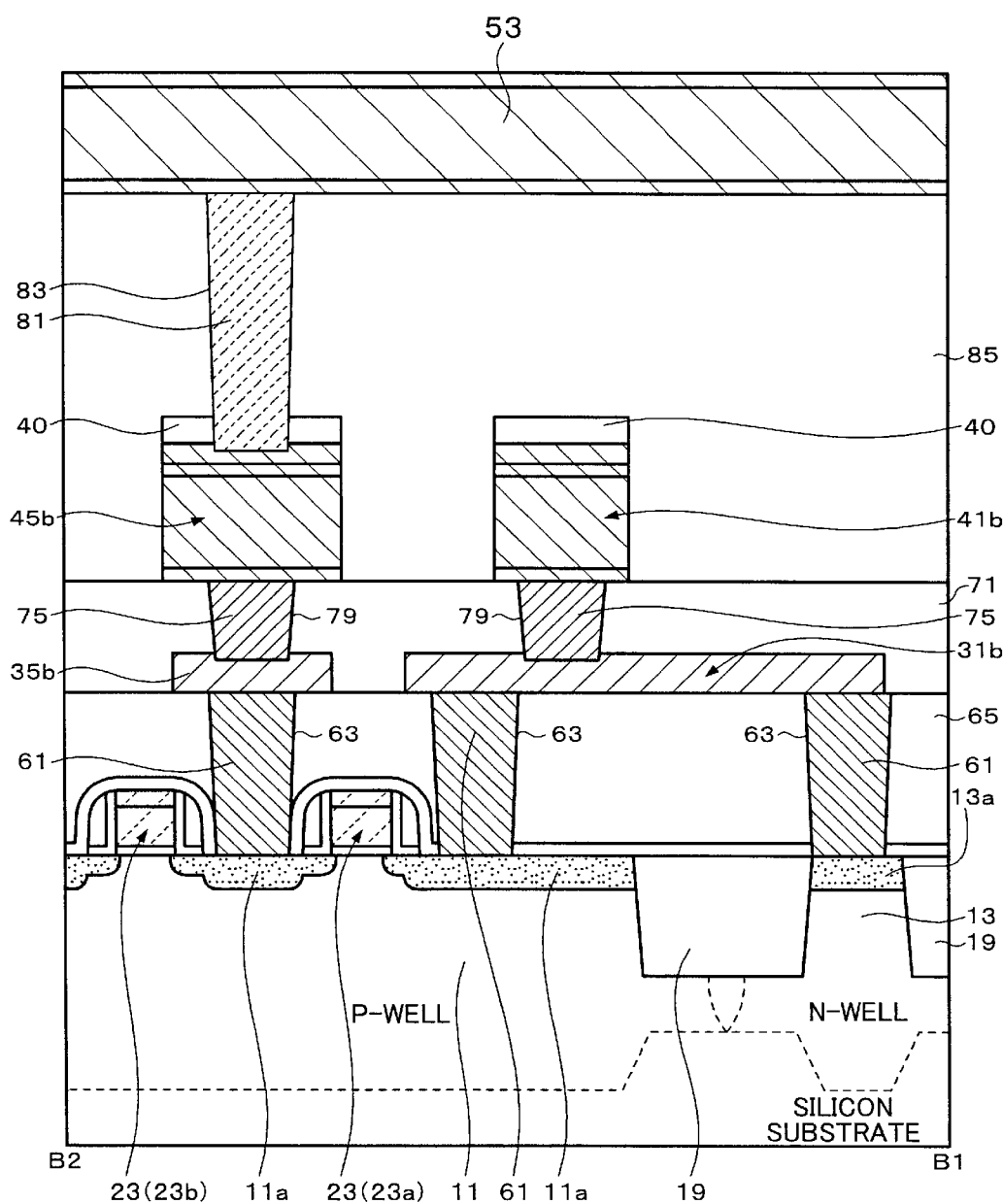
FIG. 14 is a cross-sectional view of the embodiment of the present invention taken along the line B1–B2 of FIG. 2.
Figure 15:
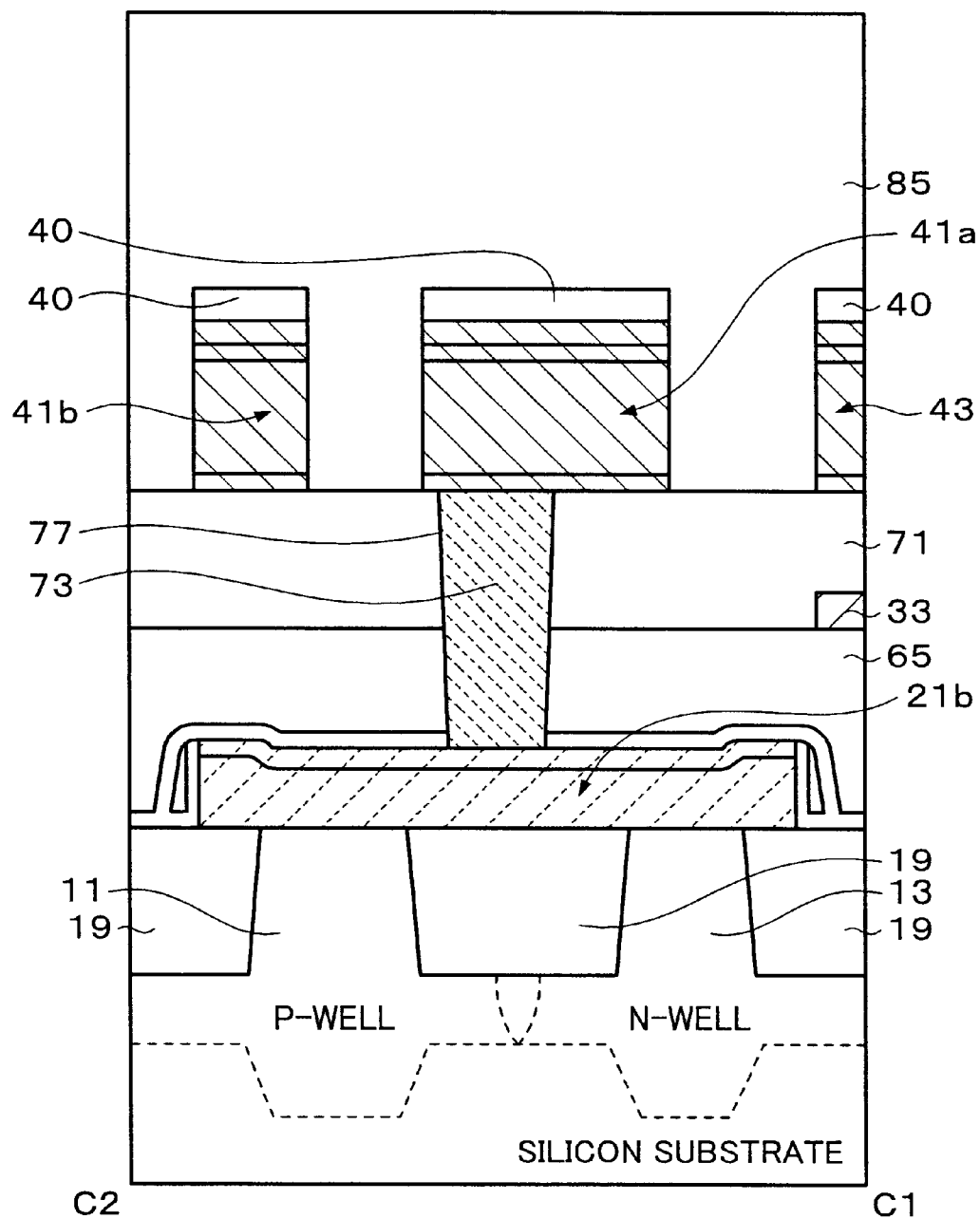
FIG. 15 is a cross-sectional view of the embodiment of the present invention taken along the line C1–C2 of FIG. 2.

The details of the structure of the present embodiment are described below with reference to FIGS. 2 to 15 in the order from the lower layers. Note that a line B1–B2 and a line C1–C2 are drawn in FIGS. 2 to 13. FIG. 14 is a view showing the cross section taken along the line B1–B2. FIG. 15 is a view showing the cross section taken along the line C1–C2.

(a) Field and First Conductive Layer

Figure 11:
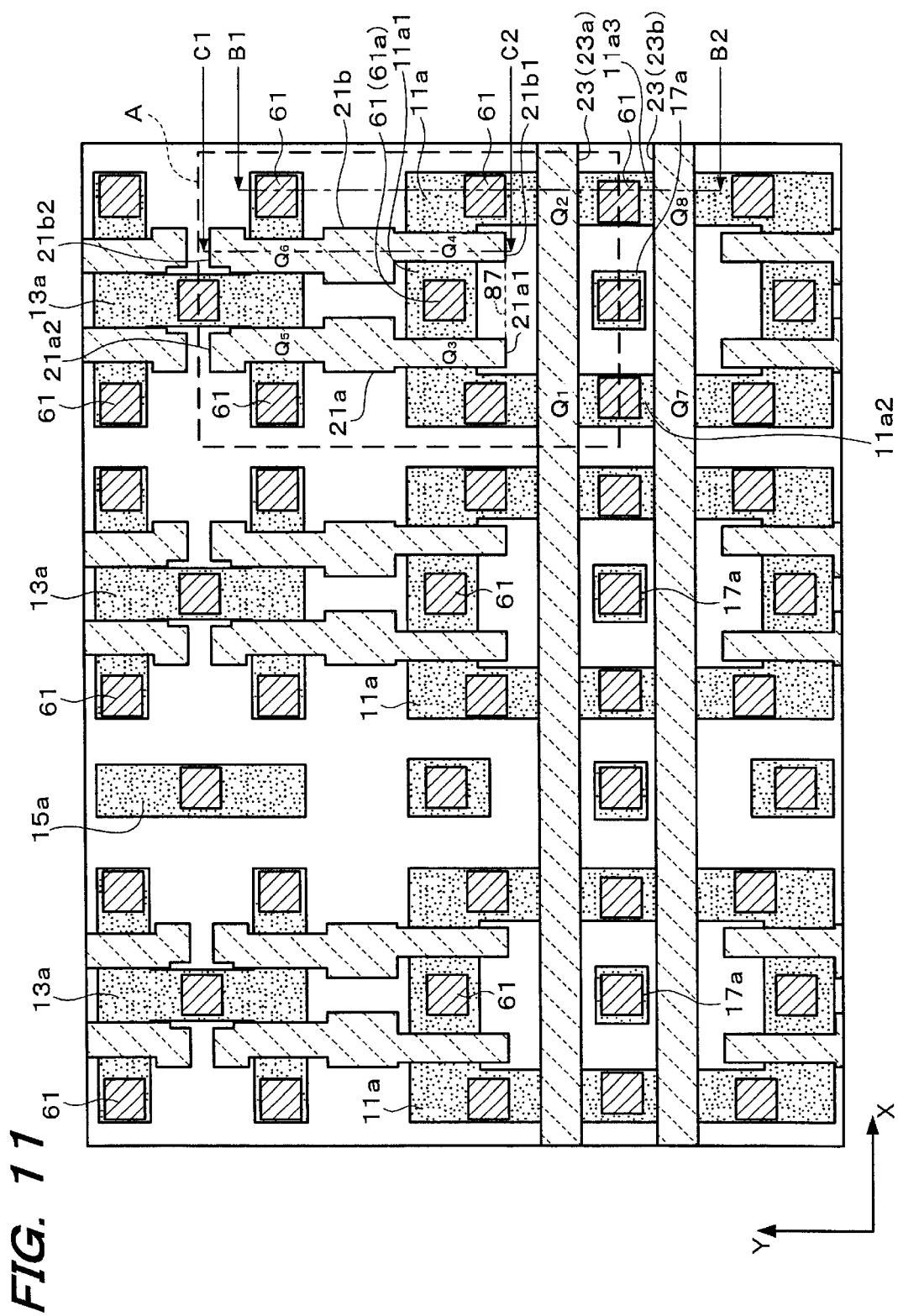
FIG. 11 is a plan view showing the field, first conductive layer, and plugs 61 in the embodiment of the present invention.

FIG. 11 is a plan view showing the field and the first conductive layer. First, the field is described with reference to FIGS. 2, 14, and 15. FIG. 2 is a plan view showing the field. The field includes the active regions 11, 13, 15, and 17 and the element isolation regions 19. The active regions 11, 13, 15, and 17 are formed on the surface of a silicon substrate.

The active regions 11 have a rectangular shape with a rectangular opening formed therein. In FIG. 2, a plurality of the active regions 11 is arrayed in the X-axial direction. The transfer transistors $Q_1$ and $Q_2$ and the driver transistors $Q_3$ and $Q_4$ shown in FIG. 1 are formed in the active regions 11.

The active regions 13 resemble the letter "H" in shape. In FIG. 2, a plurality of the active regions 13 is arrayed in the X-axial direction. The load transistors $Q_5$ and $Q_6$ shown in FIG. 1 are formed in the active regions 13.

The active regions 15 are formed in every 32 memory cells arrayed in the X-axial direction, for example. A well contact region of an n well is formed in the active region 15. An n well corresponding to 32 memory cells is connected to a $V_{DD}$ line (power supply line) through the well contact region.

The active regions 17 are formed in every two memory cells arrayed in the Y-axial direction. A well contact region of a p well is formed in the active region 17. A p well corresponding to two memory cells is connected to a $V_{SS}$ line (ground line) through the well contact region.

The active regions 11, 13, 15, and 17 are isolated from one another by the element isolation regions 19 (thickness: 400 nm, for example). The element isolation regions 19 are formed by STI (Shallow Trench Isolation), for example.

FIGS. 14 and 15 show the cross sections of the field taken along the line B1–B2 and the line C1–C2 shown in FIG. 2, respectively. The active regions 11 and 13 and the element isolation region 19 are shown in these cross sections.

The first conductive layer located on the field is described below with reference to FIGS. 3, 11, 14, and 15. FIG. 3 is a plan view showing the first conductive layer. A plurality of the gate electrode layers 21a and 21b and a plurality of the sub-word lines 23 (sub-word lines 23a and 23b are shown in FIG. 3) are disposed in the first conductive layer. The gate electrode layers 21a and 21b and the sub-word lines 23 have a structure in which a salicide layer is formed on a polysilicon layer, for example.

The gate electrode layers 21a and 21b respectively have a linear pattern extending in the Y-axial direction in FIG. 3. A pair of the gate electrode layers 21a and 21b is disposed in parallel in each memory cell region. The gate electrode layers 21a and 21b become the gate electrodes of the driver transistors $Q_3$ and $Q_4$ and the load transistors $Q_5$ and $Q_6$ shown in FIG. 1. The gate length of the driver transistors $Q_3$ and $Q_4$ is 0.18 μm, for example. The gate length of the load transistors $Q_5$ and $Q_6$ is 0.20 μm, for example.

The sub-word lines 23 have a linear pattern extending in the X-axial direction in FIG. 3. The sub-word lines 23 are located on the driver transistor side. The sub-word lines 23 are activated or deactivated by a main-word line located in the upper layer. The sub-word lines 23 become the gate electrodes of the transfer transistors (sub-word line 23a becomes the gate electrodes of the transfer transistors $Q_1$ and $Q_2$ shown in FIG. 1). The gate length of the transfer transistors is 0.24 μm, for example.

FIGS. 14 and 15 show the cross sections of the first conductive layer taken along the line B1–B2 and the line C1–C2 shown in FIG. 3, respectively. The sub-word lines 23a and 23b and the gate electrode layer 21b are shown in these cross sections.

Source/drain regions and the like formed in the active regions are described below. n⁺-type source/drain regions 11a are formed in the active regions 11, as shown in FIG. 11. A p⁺-type source/drain regions 13a are formed in the active regions 13. An n⁺-type well contact region 15a is formed in the active region 15. p⁺-type well contact regions 17a are formed in the active regions 17.

The source/drain region is a region which functions as at least either the source or drain. The transfer transistor $Q_1$ and a transfer transistor $Q_7$ which uses the sub-word line 23b as the gate electrode uses an n⁺-type source/drain region 11a2 among the n⁺-type source/drain regions 11a. The transfer transistor $Q_2$ and a transfer transistor $Q_8$ which uses the sub-word line 23b as the gate electrode uses an n⁺-type source/drain region 11a3 among then n⁺-type source/drain regions 11a.

Figure 4:
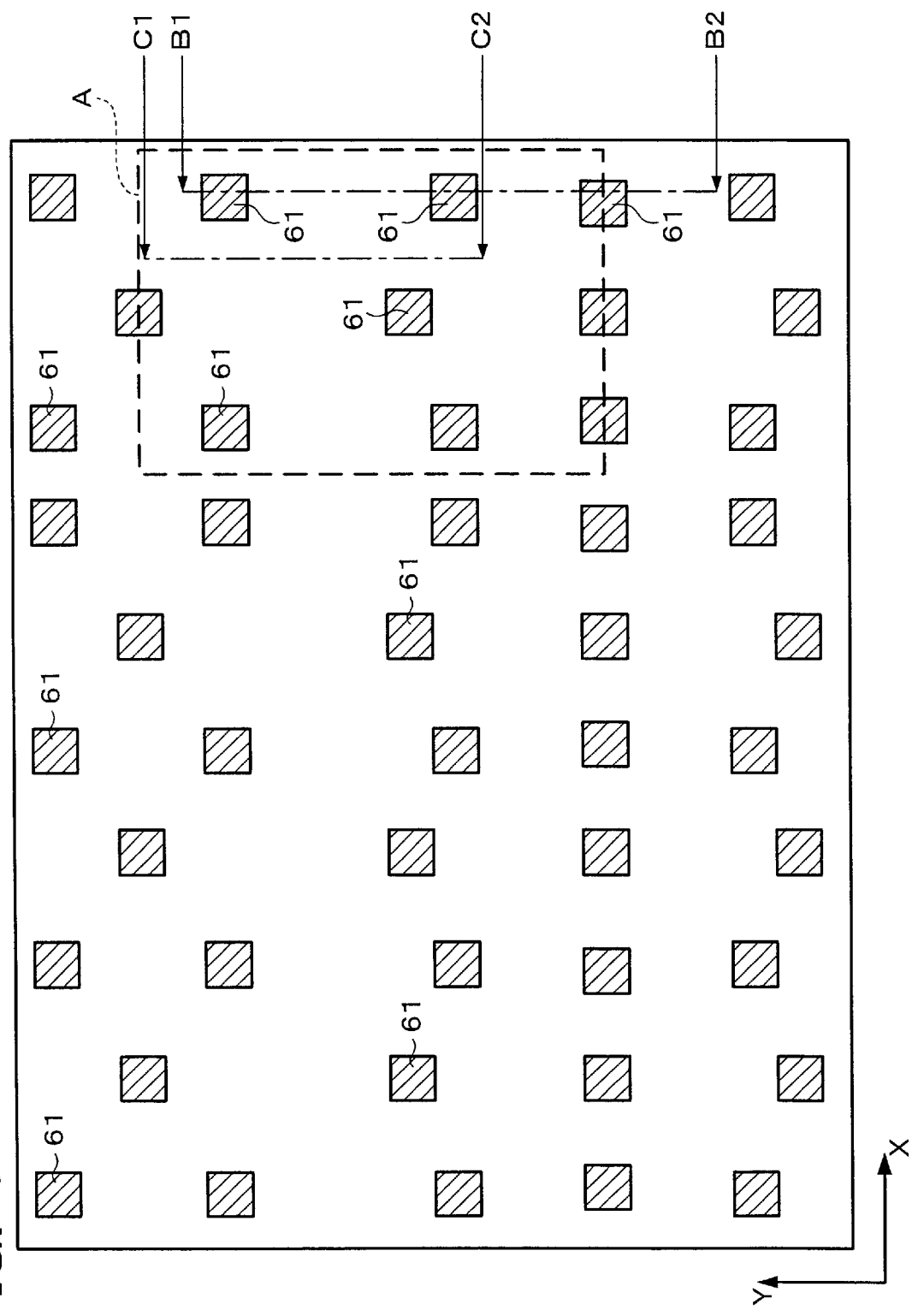
FIG. 4 is a plan view showing plugs 61 in part of the memory cell array of the embodiment of the present invention.

An interlayer dielectric 65 (not shown in FIG. 11) such as a silicon oxide layer is formed to cover the field and the first conductive layer. The interlayer dielectric 65 is planarized using CMP, as shown in FIGS. 14 and 15. A plurality of contact holes 63 for exposing the n⁺-type source/drain regions 11a and the like is formed in the interlayer dielectric 65. The contact holes 63 are filled with plugs 61. The plugs 61 are connected to the n⁺-type source/drain regions 11a, the p⁺-type source/drain regions 13a, the n⁺-type well contact region 15a, and the p⁺-type well contact region 17a. FIG. 4 is a plan view showing the pattern of the plugs 61. As a material for the plugs 61, tungsten and the like can be used. The diameter at the upper end of the contact holes 63 is 0.30 μm, for example. The diameter at the lower end of the contact holes 63 is 0.24 μm, for example.

(b) Second Conductive Layer

The second conductive layer is located on the structure shown in FIG. 11. A plurality of the drain-drain connecting layers 31a and 31b, $V_{DD}$ line 33, a plurality of BL (bit line, bit line/) contact pad layers 35a and 35b, and a plurality of $V_{SS}$ local interconnects 37 are disposed in the second conductive layer, as shown in FIG. 5. For example, these layers and lines have a structure in which a titanium nitride layer (thickness: 135 nm, for example) is formed on a titanium layer (thickness: 8.5 nm, for example) which is an underlay. The $V_{SS}$ local interconnects 37 also function as contact pad layers.

The drain-drain connecting layers 31a and 31b respectively have a linear pattern extending in the Y-axial direction in FIG. 5. The width of a body section 31a3 of the drain-drain connecting layers 31a is smaller than the width of end sections 31a1 and 31a2 of the drain-drain connecting layers 31a. The width of a body section 31b3 of the drain-drain connecting layers 31b is smaller than the width of end sections 31b1 and 31b2 of the drain-drain connecting layers 31b. The width of the body sections 31a3 and 31b3 is a minimum design-rule width. A pair of the drain-drain connecting layers 31a and 31b is disposed in each memory cell region. A pair of the gate electrode layers 21a and 21b is located between the drain-drain connecting layer 31a and the drain-drain connecting layer 31b, as shown in FIG. 1.

The $V_{SS}$ local interconnects 37 have a linear pattern extending in the Y-axial direction in FIG. 5. The width of the end sections of the $V_{SS}$ local interconnect 37 is greater than the width of the body section. The $V_{SS}$ local interconnects 37 are located between the end section 31a2 of the drain-drain connecting layer 31a and the end section 31b2 of the drain-drain connecting layer 31b. The $V_{SS}$ local interconnects 37 extend from this location to between the end section 31a2 of the drain-drain connecting layer 31a and the end section 31b2 of the drain-drain connecting layer 31b in the memory cell located below in FIG. 5. One $V_{SS}$ local interconnect 37 is disposed in two memory cells.

The BL contact pad layers 35a function as pad layers for connecting the bit lines to the n⁺-type source/drain regions 11a (see FIG. 11). The BL contact pad layers 35b function as pad layers for connecting the bit lines/ to the n⁺-type source/drain regions 11a.

The BL contact pad layers 35a are located between the drain-drain connecting layer 31a of one memory cell and the drain-drain connecting layer 31a of the memory cell located below in FIG. 5. The BL contact pad layers 35b are located between the drain-drain connecting layer 31b of one memory cell and the drain-drain connecting layer 31b of the memory cell located below in FIG. 5. Each of the BL contact pad layers 35a and 35b is disposed in two memory cells.

The $V_{DD}$ line 33 has a linear pattern extending in the X-axial direction in FIG. 5. The $V_{DD}$ line 33 extends so as to three-dimensionally intersect the n⁺-type well contact region 15a (see FIG. 11). The $V_{DD}$ line 33 has branched sections 33a and 33b above the n⁺-type well contact region 15a.

The drain-drain connecting layers 31a and 31b, the $V_{DD}$ line 33, the BL contact pad layers 35a and 35b, and the $V_{SS}$ local interconnects 37 which are disposed in the second conductive layer shown in FIG. 5 are connected to the plugs 61 shown in FIG. 11. These connections are indicated by contact sections 61 m in FIG. 5.

The cross section of the second conductive layer shown in FIG. 5 taken along the line B1–B2 is shown in FIG. 14. The drain-drain connecting layer 31b and the BL contact pad layer 35b are shown in this cross section.

Figure 12:
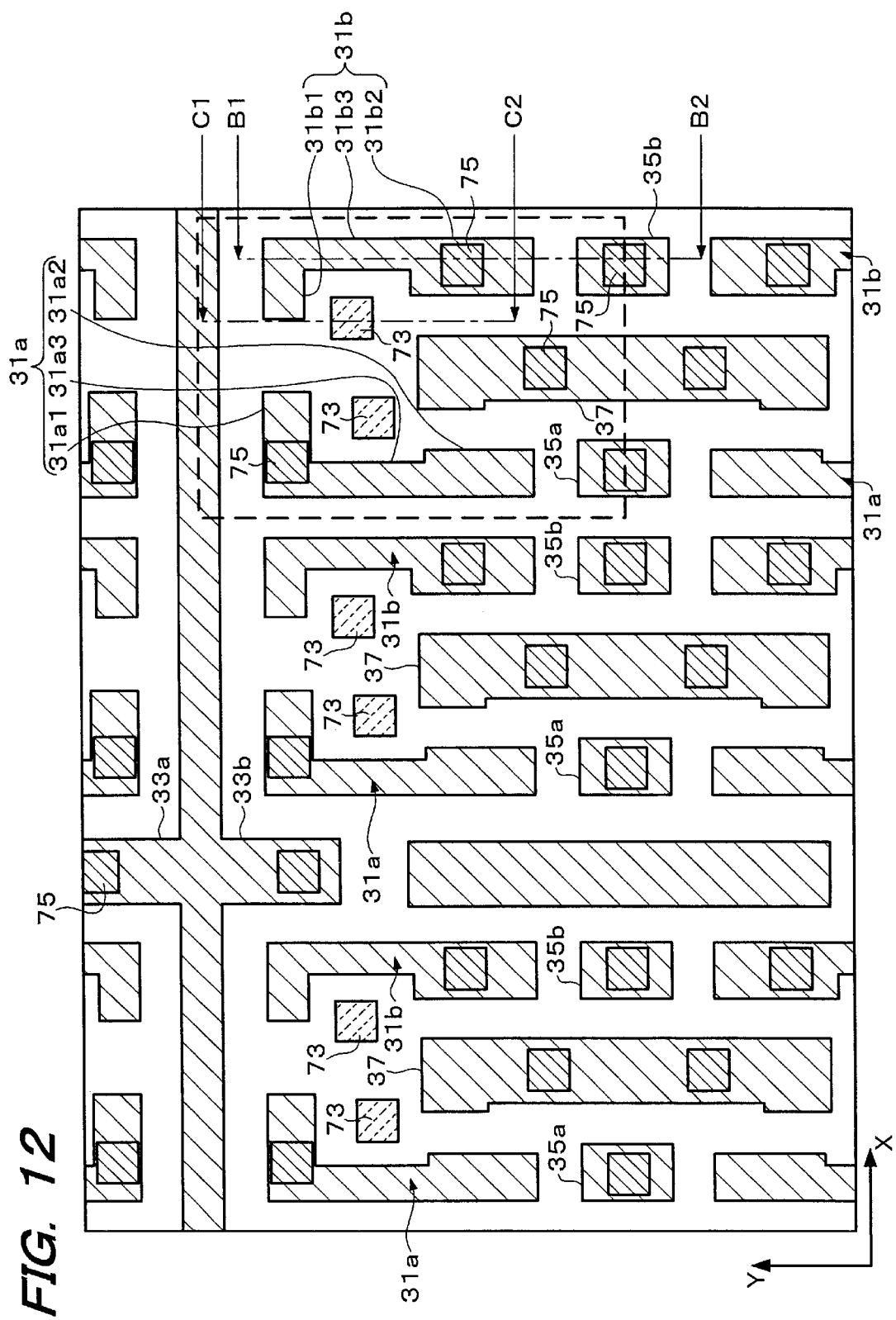
FIG. 12 is a plan view showing the second conductive layer and the plugs 73 and 75 in the embodiment of the present invention.

An interlayer dielectric 71 (not shown in FIG. 5) such as a silicon oxide layer is formed to cover the second conductive layer. The interlayer dielectric 71 is planarized using CMP, as shown in FIGS. 14 and 15. A plurality of through-holes 79 for exposing the drain-drain connecting layers 31b and the like is formed in the interlayer dielectric 71, as shown in FIG. 14. The through-holes 79 are filled with plugs 75. A through-hole 77 for exposing the gate electrode layer 21b is formed in the interlayer dielectrics 71 and 65, as shown in FIG. 15. The through-holes 77 are filled with plugs 73. FIG. 12 shows a planar relation between the plugs 73 and 75 and the second conductive layer.

Figure 6:
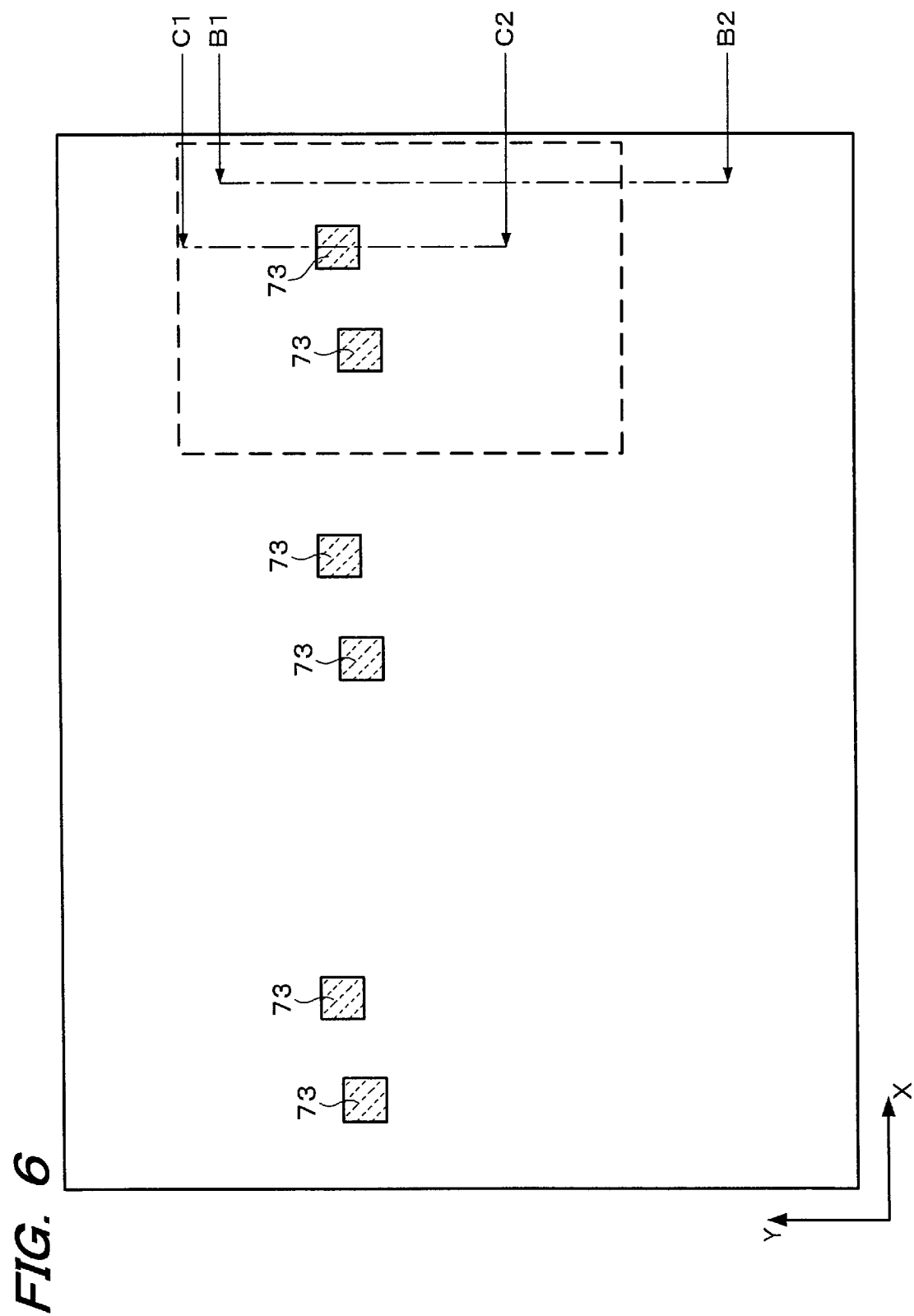
FIG. 6 is a plan view showing plugs 73 in part of the memory cell array of the embodiment of the present invention.

The plugs 73 are described below. FIG. 6 is a plan view showing the pattern of the plugs 73. The plugs 73 are connected to the gate electrode layers 21a and 21b (see FIG. 3). The cross section of the plugs 73 is described below with reference to FIG. 15. The plugs 73 are buried in the through-holes 77 formed through the interlayer dielectrics 65 and 71. In this cross section, the plug 73 is connected to the gate electrode layer 21b. As a material for the plugs 73, tungsten and the like can be used. The diameter at the upper end of the through-holes 77 is 0.32 µm, for example. The diameter at the lower end of the through-holes 77 is 0.24 µm, for example.

Figure 7:
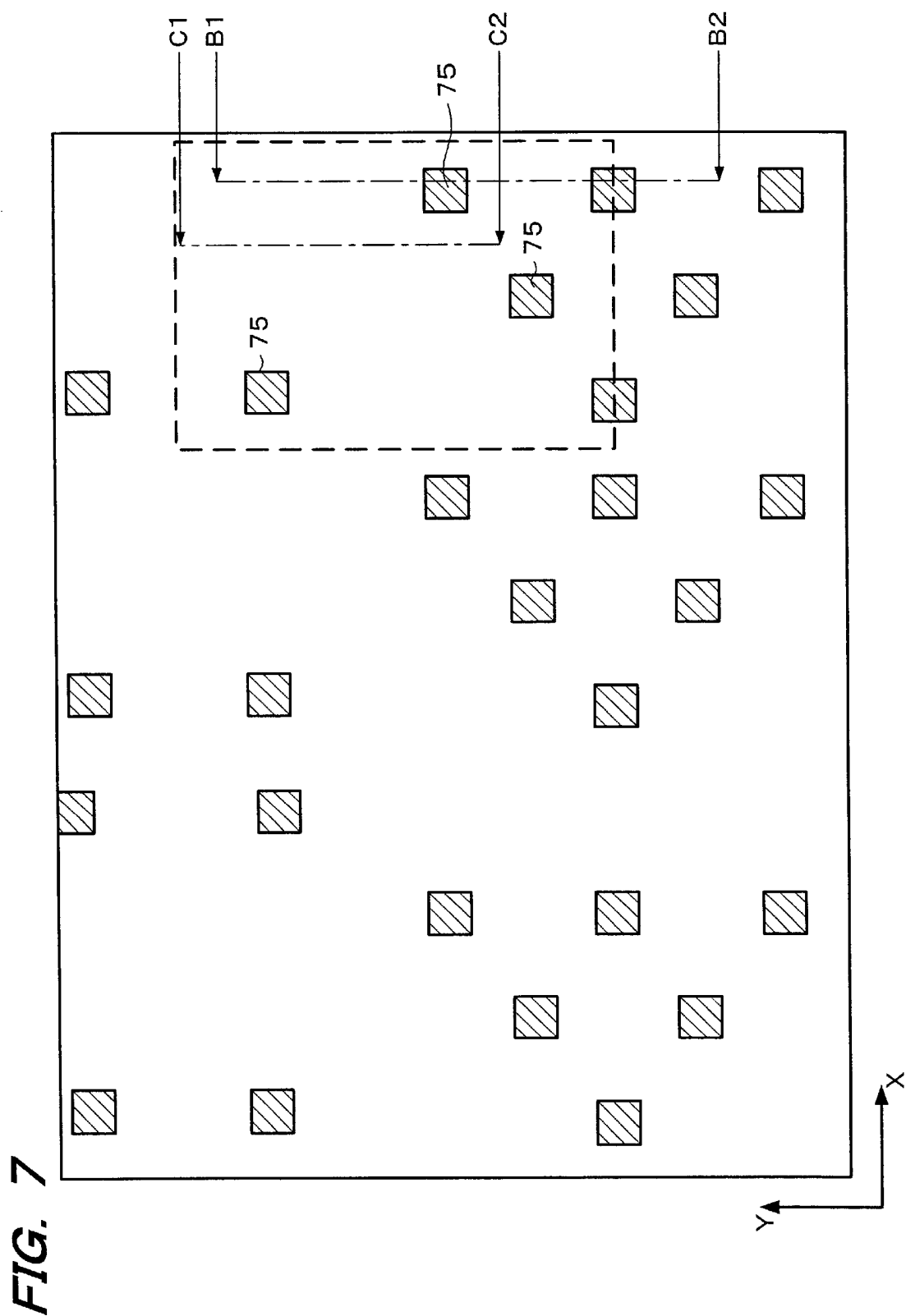
FIG. 7 is a plan view showing plugs 75 in part of the memory cell array of the embodiment of the present invention.

The plugs 75 are described below. FIG. 7 is a plan view showing the pattern of the plugs 75. The plugs 75 are connected to the drain-drain connecting layers 31a and 31b, the branched sections 33a and 33b of the $V_{DD}$ line 33, the BL contact pad layers 35a and 35b, and the $V_{SS}$ local interconnects 37, as shown in FIG. 12. The cross section of the plugs 75 is described below with reference to FIG. 14. The plugs 75 are buried in the through-holes 79 formed through the interlayer dielectric 71. In this cross section, the plugs 75 are connected to the drain-drain connecting layer 31b and the BL contact pad layer 35b. As a material for the plugs 75, tungsten and the like can be used. The diameter at the upper end of the through-holes 79 is 0.30 µm, for example. The diameter at the lower end of the through-holes 79 is 0.24 µm, for example.

(c) Third Conductive Layer

The third conductive layer is located on the structure shown in FIG. 12. A plurality of the drain-gate connecting layers 41a and 41b, main-word line 43, a plurality of BL contact pad layers 45a and 45b, a plurality of $V_{SS}$ contact pad layers 47, and a plurality of $V_{DD}$ contact pad layers 49 are disposed in the third conductive layer, as shown in FIG. 8. These layers and lines have a structure in which a titanium nitride layer, an aluminum-copper alloy layer, a titanium layer, and a titanium nitride layer are laminated in that order, for example.

Each drain-gate connecting layer 41a includes a body section 41a3 and two end sections 41a1 and 41a2. The body section 41a3 extends in the X-axial direction in FIG. 8. The end section 41a1 is bent toward the drain-gate connecting layer 41b. Each drain-gate connecting layer 41b includes a body section 41b3 and two end sections 41b1 and 41b2. The body section 41b3 extends in the X-axial direction in FIG. 8. The end section 41b1 is bent toward the drain-gate connecting layer 41a. A pair of the drain-gate connecting layers 41a and 41b is disposed in each memory cell region.

The BL contact pad layers 45a function as pad layers for connecting the bit lines to the n$^+$-type source/drain regions 11a. The BL contact pad layers 45b function as pad layers for connecting the bit lines/ to the n$^+$-type source/drain regions 11a. One BL contact pad layer 45a and one BL contact pad layer 45b are respectively disposed in two memory cells.

The $V_{SS}$ contact pad layers 47 extend in the Y-axial direction in FIG. 8 and have two end sections. The $V_{SS}$ contact pad layers 47 are located between the BL contact pad layers 45a and the BL contact pad layers 45b. One $V_{SS}$ contact pad layer 47 is disposed in two memory cells.

The main-word line 43 extends linearly in the X-axial direction in FIG. 8. The main-word line 43 is located above the $V_{DD}$ line 33 shown in FIG. 5. The $V_{DD}$ contact pad layers 49 are located above the branched sections 33a and 33b of the $V_{DD}$ line 33 shown in FIG. 5.

Each of the end sections 41a1 of the drain-gate connecting layers 41a and the end sections 41b1 of the drain-gate connecting layers 41b is connected to the plugs 73 shown in FIG. 12. These connections are indicated by contact sections 73m in FIG. 8. Each of the end sections 41a2 of the drain-gate connecting layers 41a, the end sections 41b2 of the drain-gate connecting layers 41b, the BL contact pad layers 45a and 45b, the $V_{SS}$ contact pad layers 47, and the $V_{DD}$ contact pad layers 49 is connected to the plugs 75 shown in FIG. 12. These connections are indicated by contact sections 75m in FIG. 8.

FIGS. 14 and 15 show the cross sections of the third conductive layer taken along the line B1–B2 and the line C1–C2 shown in FIG. 8, respectively. The drain-gate connecting layers 41a and 41b, the BL contact pad layer 45b, and the main-word line 43 are shown in these cross sections. Hard mask layers 40 formed of a silicon oxide layer are formed on the third conductive layer including these layers and lines. The third conductive layer is patterned using the hard mask layers 40 as masks. This is because it is difficult to pattern the third conductive layer using only a resist as a mask due to miniaturization of memory cells.

Figure 9:
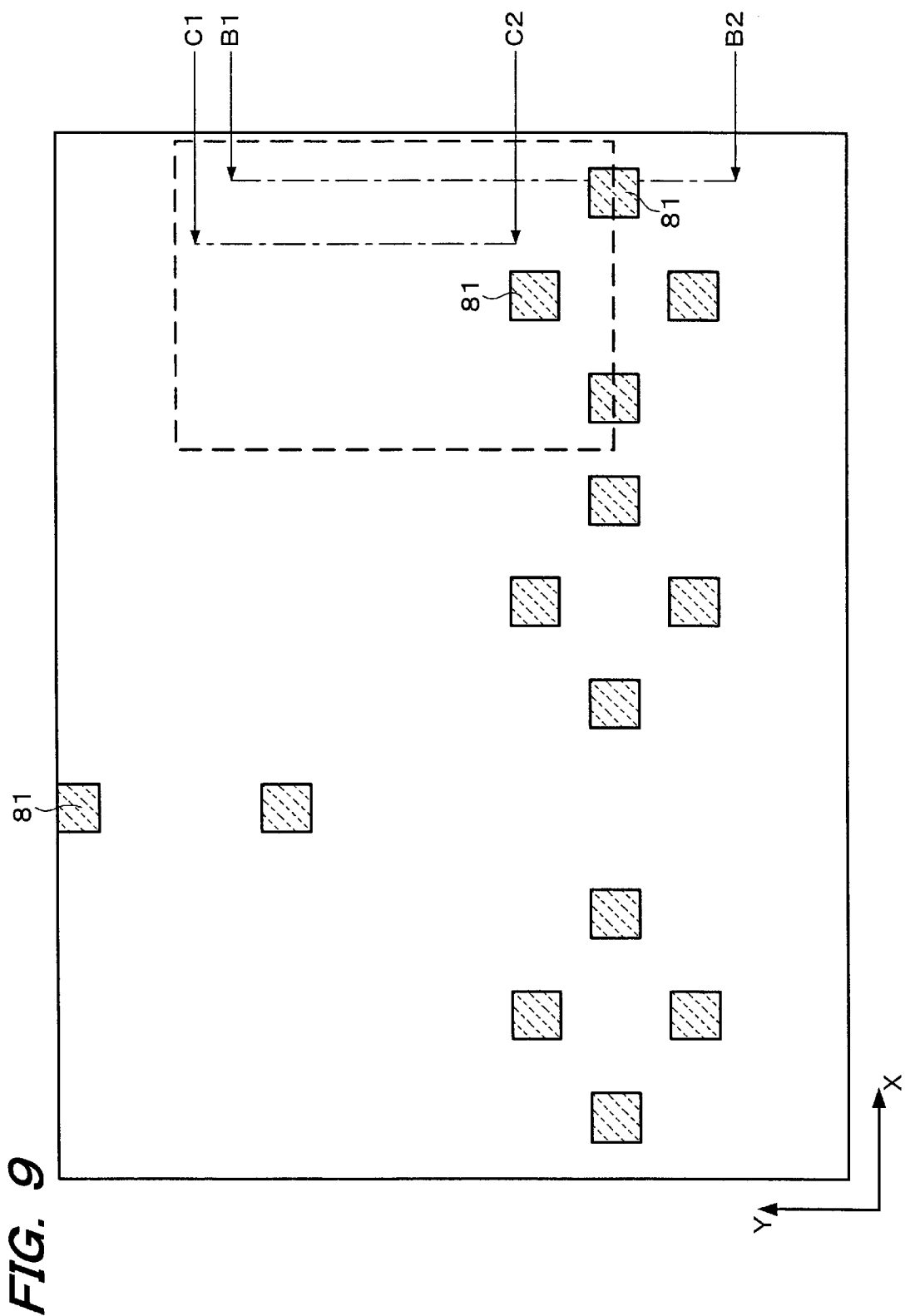
FIG. 9 is a plan view showing plugs 81 in part of the memory cell array of the embodiment of the present invention.

An interlayer dielectric such as a silicon oxide layer is formed to cover the third conductive layer. This interlayer dielectric 85 is planarized using CMP, as shown in FIGS. 14 and 15. Through-holes 83 for exposing the BL contact pad layers 45a and the like are formed in the interlayer dielectric 85. The through-hole 83 is filled with plug 81. FIG. 13 is a plan view showing this configuration. The plugs 81 are connected to the BL contact pad layers 45a and 45b, the $V_{SS}$ contact pad layers 47, and the $V_{DD}$ contact pad layers 49, as shown in FIG. 13. FIG. 9 is a plan view showing the pattern of the plugs 81. As a material for the plugs 81, tungsten and the like can be used. The diameter at the upper end of the through-holes 83 is 0.36 µm, for example. The diameter at the lower end of the through-holes 83 is 0.28 µm, for example.

(d) Fourth Conductive Layer

The fourth conductive layer is located on the structure shown in FIG. 13. A plurality of bit lines 51, a plurality of bit lines/ 53, a plurality of $V_{SS}$ lines 55, and a $V_{DD}$ line 57 are disposed in the fourth conductive layer, as shown in FIG. 10. These lines extend linearly in the Y-axial direction in FIG. 10. The $V_{SS}$ lines 55 are disposed between the bit lines 51 and the bit lines/53 at the center of the memory cells. One $V_{DD}$ line 57 is disposed in every 32 memory cells arrayed in the X-axial direction. Each of these lines is connected to the plugs 81 shown in FIG. 13. These connections are indicated by contact sections 81m in FIG. 10. The bit lines 51 and the like have a structure in which a titanium nitride layer, an aluminum-copper alloy layer, and a titanium nitride layer are laminated in that order, for example.

The cross section of the fourth conductive layer shown in FIG. 10 taken along the line B1–B2 is shown in FIG. 14. The bit line/53 is shown in this cross section. A signal which compensates a signal flowing through the bit lines 51 flows through the bit lines/53. The details of the structure of the present embodiment are described above.

The patterns shown in FIGS. 1 to 13 are design patterns. These patterns have corner sections. However, in a pattern actually formed on the semiconductor substrate, a line which specifies the corner sections is curved due to the proximity effect of light.

3. Major Effects of Present Embodiment

Major effects of the present embodiment are described below.

(1) According to the present embodiment, the size of the SRAM can be reduced. The reasons therefor are as follows. In the present embodiment, information is stored using a flip-flop of the memory cell. A flip-flop is formed by connecting an input terminal (gate electrode) of a first inverter to an output terminal (drain) of a second inverter, and connecting an input terminal (gate electrode) of the second inverter to an output terminal (drain) of the first inverter. Specifically, the flip-flop is formed by cross-coupling the first inverter and the second inverter. In the case of forming a flip-flop using two layers, the inverters can be cross-coupled by forming each of a drain-drain connecting layer for connecting the drains of the inverters and a drain-gate connecting layer for connecting the gate and the drain of the inverters as one conductive layer.

According to this structure, these conductive layers are formed over regions including a region in which the drain of one inverter is located, a region in which the gate of the other inverter is located, and a region for connecting these regions. Therefore, the conductive layer has a pattern with three ends (for example, a pattern having a branched section in the shape of the letters "T" or "h"), or a spiral pattern in which the arms are intricate. For example, Japanese Patent Application Laid-open No. 10-41409 discloses a pattern in the shape of the letter "T" in FIG. 1. A pattern in the shape of the letter "h" is disclosed by M. Ishida, et al. in *IEDM Technical Digest*, 1998, page 203, FIG. 4(*b*), for example. An example of a spiral pattern is disclosed by M. Ishida, et al. in *IEDM Technical Digest*, 1998, page 203, FIG. 3(*b*). These complicated patterns make it difficult to accurately reproduce the shape of a minute pattern in a photoetching process, whereby a desired pattern cannot be obtained. This hinders miniaturization of the memory cell size.

According to the present embodiment, the gate electrode layers (21*a*, 21*b*) which become the gates of the CMOS inverters, the drain-drain connecting layers (31*a*, 31*b*) for connecting the drains of the CMOS inverters, and the drain-gate connecting layers (41*a*, 41*b*) for connecting the gate of one CMOS inverter to the drain of the other CMOS inverter are respectively formed in different layers. Therefore, a flip-flop is formed using these three layers. Because of this, the pattern of each layer can be simplified (linearly, for example) in comparison with a case of forming a flip-flop using two layers. According to the present embodiment, since the pattern of each layer can be thus simplified, an SRAM of the 0.18 μm generation with a memory cell size of 4.5 μm or less can be fabricated, for example.

(2) According to the present embodiment, parasitic resistance in the source region of the driver transistor can be decreased. Moreover, the pattern of the source region can be simplified. First, terms used to describe the reasons for these advantages (a region between gate electrode layers, an n$^+$-type source region 11*a*1, and a source contact layer 61*a*) are described below before describing the reasons.

These terms are described below with reference to FIG. 11. The region between gate electrode layers is a region between the gate electrode layer 21*a* and the gate electrode layer 21*b*. Specifically, the region between gate electrode layers is specified by the side of the gate electrode layer 21*a*, a line 87 which connects the end section 21*a*1 of the gate electrode layer 21*a* to the end section 21*b*1 of the gate electrode layer 21*b*, the side of the gate electrode layer 21*b*, and a line (not shown) which connects the end section 21*b*2 of the gate electrode layer 21*b* to the end section 21*a*2 of the gate electrode layer 21*a*. The n$^+$-type source region 11*a*1 is a region which becomes the source of the driver transistors $Q_3$ and $Q_4$ among the n$^+$-type source/drain regions 11*a*. The source contact layer 61*a* is the plug 61 formed in the source region 11*a*1.

The above reasons are described below with reference to FIGS. 1 and 11. Assume that the drain-gate connecting layers 41*a* and 41*b* (see FIG. 13) are located in the same layer as the drain-drain connecting layers 31*a* and 31*b*. In this structure, the source contact layer 61*a* of the driver transistors $Q_3$ and $Q_4$ cannot be located in the region between gate electrode layers. This is because the source contact layer 61*a* is in contact with the drain-gate connecting layer 41*b*. In order to avoid this, at least part of the source contact layer 61*a* is formed outside the region between gate electrode layers (specifically, at least part of the source contact layer 61*a* crosses the line 87). This increases the area of the source region 11*a*1, there by leading to the following two problems. One of these problems is that parasitic resistance in the source region increases since the source contact layer 61*a* is apart from the channels of the driver transistors $Q_3$ and $Q_4$. The other problem is that the pattern of the source region 11*a*1 becomes complicated.

According to the present embodiment, the drain-gate connecting layer 41*b* (see FIG. 13) is located in a layer above the gate electrode layers 21*a* and 21*b*. Because of this, the source contact layer 61*a* can be located in the region between gate electrode layers while preventing the drain-gate connecting layer 41*b* from being in contact with the source contact layer 61*a*. Therefore, according to the present embodiment, the parasitic resistance of the driver transistors $Q_3$ and $Q_4$ can be decreased, and the pattern of the source region 11*a*1 can be simplified (for example, a pattern with a uniform width such as a rectangular pattern).

(3) According to the present embodiment, the resistance of the sub-word lines 23 can be decreased while preventing the narrow line effect of silicide of the sub-word lines 23 from occurring. The reasons therefor are described below with reference to FIG. 11. In the case of the above structure in which at least part of the source contact layer 61*a* is located outside the region between gate electrode layers, part of the sub-word line 23*a* must be curved toward the sub-word line 23*b* in order to prevent the sub-word line 23*a* from coming in contact with the source contact layer 61*a*. According to the present embodiment, since the source contact layer 61*a* can be located in the region between gate electrode layers, the pattern of the sub-word lines 23 can be linear while reducing the memory cell size.

According to the present embodiment, since the sub-word line 23 has a linear pattern, the length of the sub-word lines 23 can be decreased in comparison with a sub-word line of which part of the pattern is curved. Therefore, according to the present embodiment, the resistance of the sub-word line 23 can be decreased. A sub-word line of which part of the pattern is curved tends to be thinned at the curved section, thereby causing the narrow line effect of silicide to occur. According to the present embodiment, since the pattern of the sub-word lines 23 is linear and has not curved section, occurrence of the narrow line effect of silicide caused by the curved section can be prevented, thereby preventing a local increase in the resistance of the sub-word lines 23 due to the narrow line effect of silicide. In the present embodiment, the word line consists of the sub-word lines 23 and the main-word line 43. The word line may have a one-layer structure consisting of only the sub-word lines 23.

(4) According to the present embodiment, the number of memory cells which can be formed on one chip can be increased. The reasons therefor are as follows. In the case of sub-word lines having a pattern with a curved section, as described above, there is no room for forming a well contact region between the sub-word lines due to the curved section. Therefore, the well contact region must be formed in every set of a predetermined number of memory cells by providing a space therefor. However, the memory cells are not formed in these spaces, whereby the number of memory cells which can be formed in one chip decreases equivalent to the number of these dead spaces.

According to the present embodiment, since the sub-word lines 23 have a linear pattern, as shown in FIG. 11, the p$^+$-type well contact region 17a can be located between the sub-word line 23a and the sub-word line 23b. As a result, according to the present embodiment, the number of memory cells which can be formed on one chip can be increased.

(5) The p$^+$-type well contact region 17a is formed in every two memory cells arrayed in the Y-axial direction. The active region 15 which becomes the well contact region of the n well is formed in every 32 memory cells arrayed in the X-axial direction, for example. Therefore, latchup can be prevented according to the present embodiment, as described above.

What is claimed is:

1. A semiconductor memory device comprising:
   a memory cell which includes a first driver transistor, a second driver transistor, a first load transistor, a second load transistor, a first transfer transistor, and a second transfer transistor, wherein:
   the memory cell has first and second gate electrode layers, first and second drain-drain connecting layers, first and second drain-gate connecting layers, and a source contact layer;
   the first gate electrode layer includes a gate electrode of the first driver transistor and a gate electrode of the first load transistor;
   the second gate electrode layer includes a gate electrode of the second driver transistor and a gate electrode of the second load transistor;
   a source region of the first and second driver transistors is located in a region between the first and second gate electrode layers;
   the source contact layer is located in the region between the first and second gate electrode layers;
   the first and second drain-drain connecting layers are located higher than the first and second gate electrode layers;
   the first and second gate electrode layers are located between the first and second drain-drain connecting layers;
   the first drain-drain connecting layer connects a drain region of the first driver transistor to a drain region of the first load transistor;
   the second drain-drain connecting layer connects a drain region of the second driver transistor to a drain region of the second load transistor;
   the first and second drain-gate connecting layers are located higher than the first and second gate electrode layers;
   the first and second drain-gate connecting layers are located in a different layer from the first and second drain-drain connecting layers;
   the first drain-gate connecting layer connects the first drain-drain connecting layer to the second gate electrode layer; and
   the second drain-gate connecting layer connects the second drain-drain connecting layer to the first gate electrode layer.

2. The semiconductor memory device as defined in claim 1, wherein the width of the source region is approximately uniform.

3. The semiconductor memory device as defined in claim 1, wherein the source contact layer is located in the source region.

4. The semiconductor memory device as defined in claim 1, further comprising a word line, wherein:
   the word line is located on the side of the first and second driver transistors;
   the word line includes gate electrodes of the first and second transfer transistors; and
   the word line has a linear pattern.

5. The semiconductor memory device as defined in claim 4, further comprising:
   another memory cell which includes a third transfer transistor and a fourth transfer transistor;
   first and second bit lines;
   another word line; and
   a well contact region, wherein:
   the other memory cell is located adjacent to the memory cell;
   the first and third transfer transistors use in common a first source/drain region to which the first bit line is connected;
   the second and fourth transfer transistors use in common a second source/drain region to which the second bit line is connected;
   the other word line includes gate electrodes of the third and fourth transfer transistors;
   the other word line has a linear pattern;
   the well contact region is located between the word line and the other word line; and
   the memory cell and the other memory cell uses in common the well contact region.

6. The semiconductor memory device as defined in claim 5, wherein the word line is located between the source region and the well contact region.

7. The semiconductor memory device as defined in claim 5, further comprising a contact pad layer, wherein:
   the contact pad layer is used to connect the well contact region and the source region of the first and second driver transistors to a ground line; and
   the contact pad layer is located in the same layer as the first and second drain-drain connecting layers.

8. The semiconductor memory device as defined in claim 1, wherein:
   the first and second driver transistors are n-type;
   the first and second load transistors are p-type;
   the first and second transfer transistors are n-type;
   the memory cell includes first, second, third and fourth conductive layers;
   the first and second gate electrode layers and a sub-word line are located in the first conductive layer;
   the first and second drain-drain connecting layers, a power supply line, and first, second and third contact pad layers are located in the second conductive layer;
   the first and second drain-gate connecting layers, a main-word line, and fourth, fifth and sixth contact pad layers are located in the third conductive layer;
   first and second bit lines and a ground line are located in the fourth conductive layer;

the sub-word line extends in a first direction;

the power supply line is connected to source regions of the first and second load transistors;

the first contact pad layer is used to connect the first bit line to a source/drain region of the first transfer transistor;

the second contact pad layer is used to connect the second bit line to a source/drain region of the second transfer transistor;

the third contact pad layer is used to connect the source region of the first and second driver transistors to the ground line;

the main-word line extends in the first direction;

the fourth contact pad layer is used to connect the first bit line to the source/drain region of the first transfer transistor;

the fifth contact pad layer is used to connect the second bit line to the source/drain region of the second transfer transistor;

the sixth contact pad layer is used to connect the source region of the first and second driver transistors to the ground line; and the first and second bit lines extend in a second direction which is perpendicular to the first direction.

9. The semiconductor memory device as defined in claim 1, further comprising:

a plurality of the memory cells, a plurality of well contact regions of a primary conductivity type, and a plurality of well contact regions of a secondary conductivity type;

wherein each of the well contact regions of the primary conductivity type is provided for a group of a predetermined number of memory cells arrayed in a first direction among the plurality of the memory cells; and wherein each of the well contact regions of the secondary conductivity type is provided for a group of two of the memory cells arrayed in a second direction which is perpendicular to the first direction.

10. The semiconductor memory device as defined in claim 9, wherein the primary conductivity type is n-type and the secondary conductivity type is p-type.

11. The semiconductor memory device as defined in claim 1, wherein each of the first and second gate electrode layers and the first and second drain-drain connecting layers has a linear pattern; and wherein the first and second gate electrode layers and the first and second drain-drain connecting layers are parallel to each other.

12. The semiconductor memory device as defined in claim 1, wherein each of the memory cells is 4.5 $\mu m^2$ or less in area.

* * * * *